US012648403B2

(12) United States Patent
Grauer et al.

(10) Patent No.: US 12,648,403 B2
(45) Date of Patent: Jun. 2, 2026

(54) SYSTEMS AND METHODS FOR ABSOLUTE SAMPLE POSITIONING

(71) Applicant: KLA Corporation, Milpitas, CA (US)

(72) Inventors: Yoav Grauer, Haifa (IL); Amnon Manassen, Haifa (IL); Andrew V. Hill, Berkeley, CA (US); Avner Safrani, Misgav (IL)

(73) Assignee: KLA Corporation, Milpitas, CA (US)

( * ) Notice: Subject to any disclaimer, the term of this patent is extended or adjusted under 35 U.S.C. 154(b) by 770 days.

(21) Appl. No.: 17/471,007

(22) Filed: Sep. 9, 2021

(65) Prior Publication Data

US 2022/0344192 A1 Oct. 27, 2022

Related U.S. Application Data

(60) Provisional application No. 63/179,545, filed on Apr. 26, 2021.

(51) Int. Cl.
 G01B 11/00 (2006.01)
 G01B 11/27 (2006.01)
 (Continued)

(52) U.S. Cl.
 CPC ............ H10P 72/53 (2026.01); G01B 11/002 (2013.01); G01B 11/272 (2013.01); H10W 46/00 (2026.01); H10W 46/301 (2026.01)

(58) Field of Classification Search
 CPC ......... H01L 21/681; H01L 2223/54426; H01L 21/67259; H01L 23/544; G01B 11/002;
 (Continued)

(56) References Cited

U.S. PATENT DOCUMENTS 5,438,413 A * 8/1995 Mazor ................. G03F 7/70633
 356/400
5,682,243 A * 10/1997 Nishi .................. G03F 7/70425
 356/401
 (Continued)

FOREIGN PATENT DOCUMENTS

JP 2011100804 A 5/2011
JP 2011525303 A * 9/2011 ............ H10F 77/211
 (Continued)

OTHER PUBLICATIONS

International Search Report and Written Opinion in International Application No. PCT/US2022/022973 dated Aug. 16, 2022, 16 pages.
 (Continued)

*Primary Examiner* — Kara E. Geisel
*Assistant Examiner* — Judy Dao Tran
(74) *Attorney, Agent, or Firm* — Suiter Swantz IP

(57) ABSTRACT

A sample mapping system includes a sample chuck including absolute reference marks, an imaging metrology tool to capture sets of alignment images at locations associated with sample marks on a sample on the sample chuck, and a controller. A particular set of alignment images at a particular location may include at least one alignment image associated with a particular sample mark and at least one alignment image associated with a particular portion of the absolute reference marks within a field of view of the imaging metrology tool visible through the sample. The controller may determine absolute coordinates of the sample marks based on the sets of alignment images. Determining the absolute coordinates of the particular sample mark may include determining the absolute coordinates of the particular sample mark based on a position of the particular sample
 (Continued)

mark relative to the particular portion of the absolute reference marks.

32 Claims, 20 Drawing Sheets

(51) Int. Cl.
  *H10P 72/50*     (2026.01)
  *H10W 46/00*     (2026.01)
(58) Field of Classification Search
  CPC .... G01B 11/272; H10P 72/53; H10P 72/0606;
         H10W 46/00; H10W 46/301
  See application file for complete search history.

(56)            References Cited

U.S. PATENT DOCUMENTS

| | | | | |
|---|---|---|---|---|
| 8,162,584 B2 * | 4/2012 | Michael | ................ | H01L 21/681 |
| | | | | 414/217 |
| 8,655,469 B2 | 2/2014 | Choi et al. | | |
| 2003/0063278 A1 * | 4/2003 | Zaidi | ......................... | G01J 9/00 |
| | | | | 356/401 |
| 2003/0160935 A1 | 8/2003 | Lee et al. | | |
| 2003/0169423 A1 | 9/2003 | Finarov et al. | | |

| | | | | |
|---|---|---|---|---|
| 2003/0231950 A1 * | 12/2003 | Raaijmakers | ......... | H01L 21/681 |
| | | | | 414/935 |
| 2006/0215144 A1 * | 9/2006 | Shibazaki | ........... | G03F 7/70733 |
| | | | | 355/75 |
| 2008/0088812 A1 * | 4/2008 | Magnusson | ............ | G03B 27/53 |
| | | | | 355/55 |
| 2010/0139836 A1 | 6/2010 | Horikoshi | | |
| 2011/0204484 A1 * | 8/2011 | Van Der Schaar | ......................... | |
| | | | | G03F 7/70566 |
| | | | | 438/758 |
| 2013/0325179 A1 * | 12/2013 | Liao | ....................... | B25J 9/1697 |
| | | | | 700/254 |
| 2016/0290796 A1 * | 10/2016 | Levy | ................... | G03F 7/70525 |
| 2019/0346774 A1 * | 11/2019 | Maeda | ................. | G02B 26/023 |
| 2020/0124408 A1 | 4/2020 | Hill et al. | | |

FOREIGN PATENT DOCUMENTS

| | | | | | |
|---|---|---|---|---|---|
| JP | 2013115384 A | * | 6/2013 | ............. | H01L 21/66 |
| KR | 101897243 B1 | * | 9/2018 | ........... | G01B 11/002 |
| TW | 200939283 A | | 9/2009 | | |

OTHER PUBLICATIONS

Taiwan Patent Office, Office Action received in TW Application No. 111114965, Feb. 24, 2025, 47 pages (including translation).

* cited by examiner

<u>700</u>

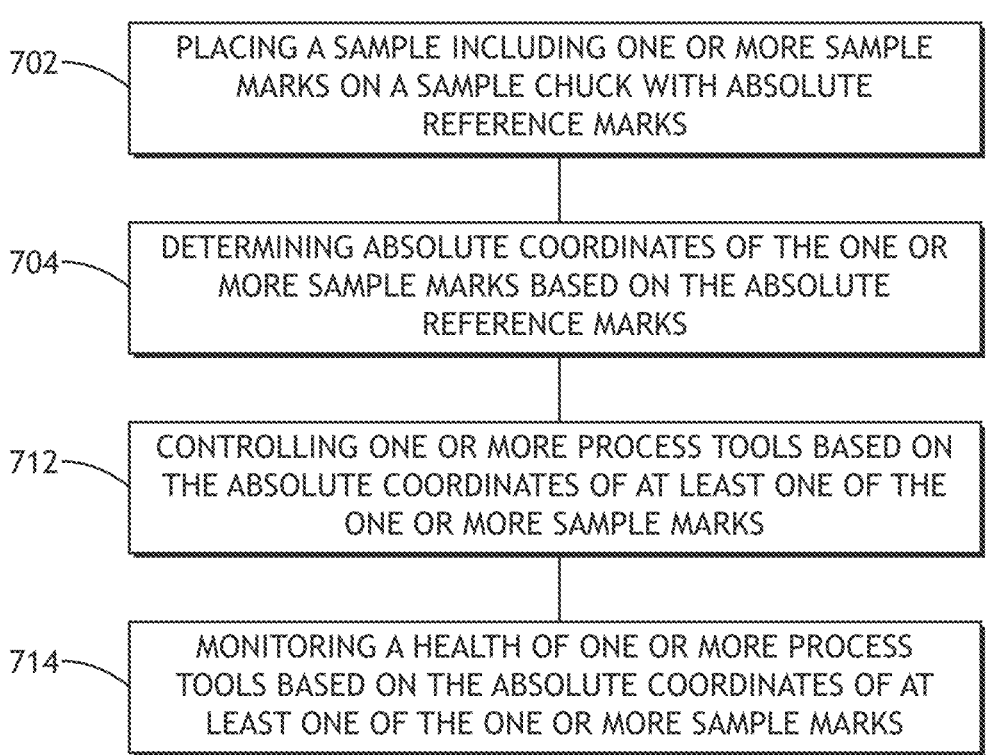

702 — PLACING A SAMPLE INCLUDING ONE OR MORE SAMPLE MARKS ON A SAMPLE CHUCK WITH ABSOLUTE REFERENCE MARKS

704 — DETERMINING ABSOLUTE COORDINATES OF THE ONE OR MORE SAMPLE MARKS BASED ON THE ABSOLUTE REFERENCE MARKS

712 — CONTROLLING ONE OR MORE PROCESS TOOLS BASED ON THE ABSOLUTE COORDINATES OF AT LEAST ONE OF THE ONE OR MORE SAMPLE MARKS

714 — MONITORING A HEALTH OF ONE OR MORE PROCESS TOOLS BASED ON THE ABSOLUTE COORDINATES OF AT LEAST ONE OF THE ONE OR MORE SAMPLE MARKS

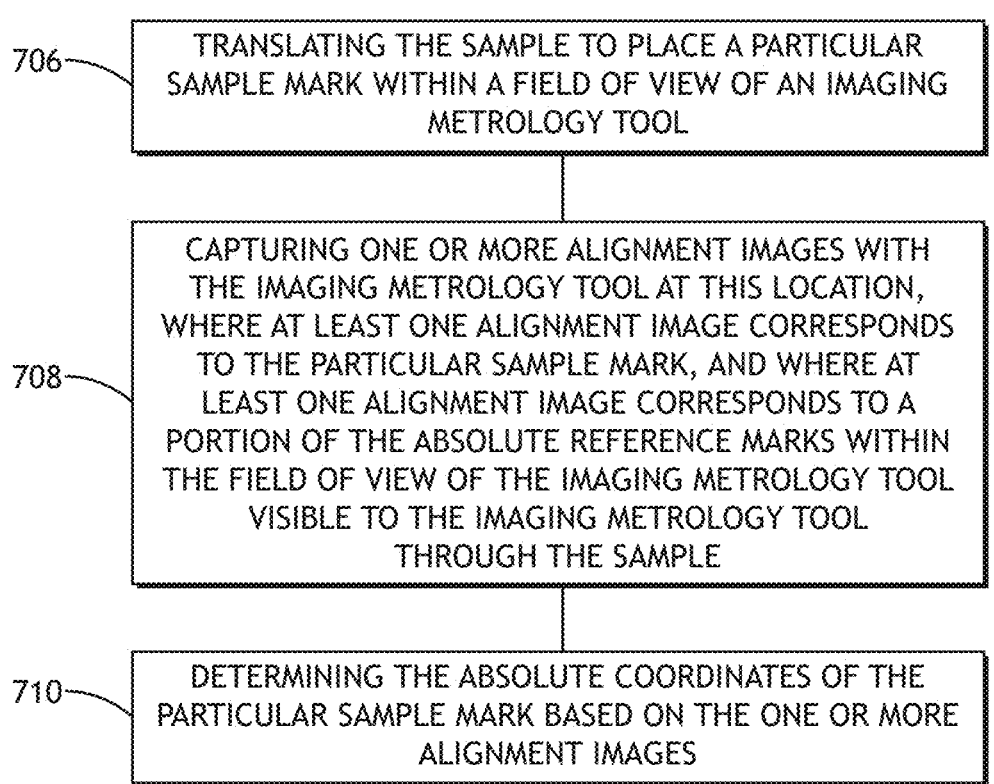

706 — TRANSLATING THE SAMPLE TO PLACE A PARTICULAR SAMPLE MARK WITHIN A FIELD OF VIEW OF AN IMAGING METROLOGY TOOL

708 — CAPTURING ONE OR MORE ALIGNMENT IMAGES WITH THE IMAGING METROLOGY TOOL AT THIS LOCATION, WHERE AT LEAST ONE ALIGNMENT IMAGE CORRESPONDS TO THE PARTICULAR SAMPLE MARK, AND WHERE AT LEAST ONE ALIGNMENT IMAGE CORRESPONDS TO A PORTION OF THE ABSOLUTE REFERENCE MARKS WITHIN THE FIELD OF VIEW OF THE IMAGING METROLOGY TOOL VISIBLE TO THE IMAGING METROLOGY TOOL THROUGH THE SAMPLE

710 — DETERMINING THE ABSOLUTE COORDINATES OF THE PARTICULAR SAMPLE MARK BASED ON THE ONE OR MORE ALIGNMENT IMAGES

FIG.7B

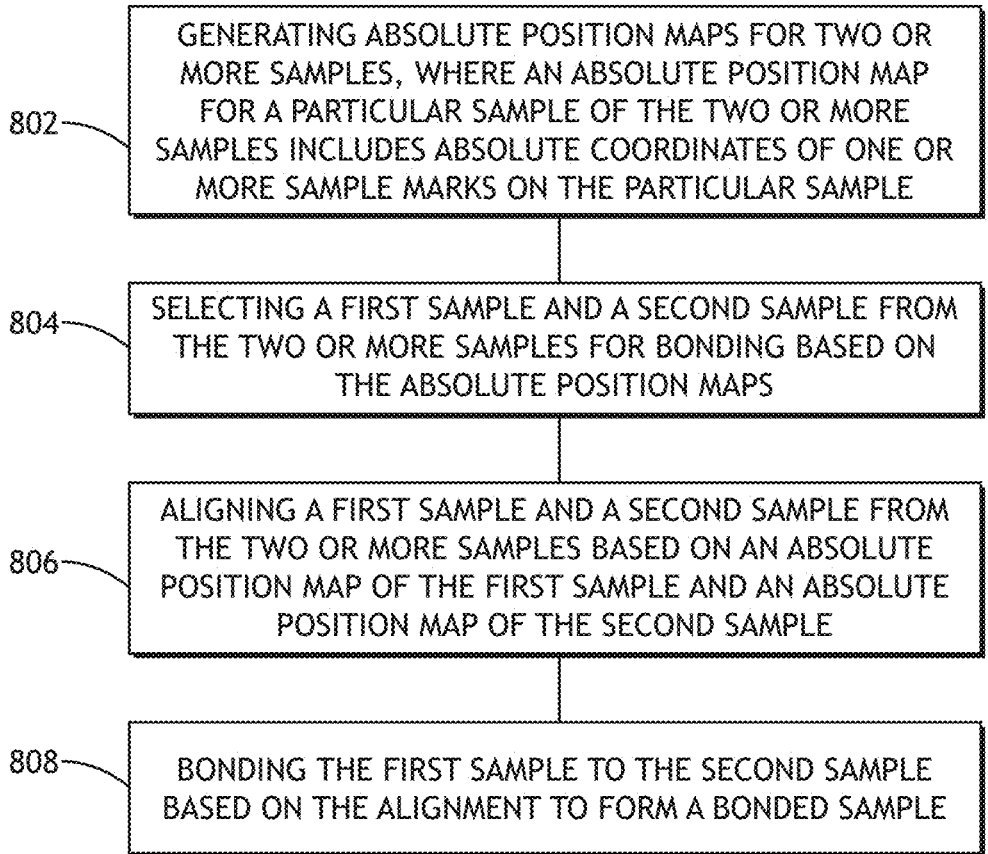

800

| 802 | GENERATING ABSOLUTE POSITION MAPS FOR TWO OR MORE SAMPLES, WHERE AN ABSOLUTE POSITION MAP FOR A PARTICULAR SAMPLE OF THE TWO OR MORE SAMPLES INCLUDES ABSOLUTE COORDINATES OF ONE OR MORE SAMPLE MARKS ON THE PARTICULAR SAMPLE |

| 804 | SELECTING A FIRST SAMPLE AND A SECOND SAMPLE FROM THE TWO OR MORE SAMPLES FOR BONDING BASED ON THE ABSOLUTE POSITION MAPS |

| 806 | ALIGNING A FIRST SAMPLE AND A SECOND SAMPLE FROM THE TWO OR MORE SAMPLES BASED ON AN ABSOLUTE POSITION MAP OF THE FIRST SAMPLE AND AN ABSOLUTE POSITION MAP OF THE SECOND SAMPLE |

| 808 | BONDING THE FIRST SAMPLE TO THE SECOND SAMPLE BASED ON THE ALIGNMENT TO FORM A BONDED SAMPLE |

FIG.8

SYSTEMS AND METHODS FOR ABSOLUTE SAMPLE POSITIONING

CROSS-REFERENCE TO RELATED APPLICATION

The present application claims the benefit under 35 U.S.C. § 119(e) of U.S. Provisional Application Ser. No. 63/179,545, filed Apr. 26, 2021, entitled OVERLAY MARK REGISTRATION METHOD AND SYSTEM FOR ADVANCED PACKAGING, naming Yoav Grauer and Amnon Manassen as inventors, which is incorporated herein by reference in the entirety.

TECHNICAL FIELD

The present disclosure relates generally to sample positioning and, more particularly, to determining absolute coordinates of features on a sample.

BACKGROUND

Advanced packaging schemes such as wafer-to-wafer bonding and die-to-wafer bonding are being increasingly explored as techniques to meet increasing demands for increased density and shrinking feature size on fabricated semiconductor devices. As the density increases and feature sizes shrink, determination of the absolution positions of features such as bond pads becomes critical to maintaining bond quality and yield.

SUMMARY

A sample mapping system is disclosed in accordance with one or more illustrative embodiments of the present disclosure. In one illustrative embodiment, the system includes a sample chuck including absolute reference marks. In another illustrative embodiment, the system includes an imaging metrology tool configured to capture sets of one or more alignment images at locations associated with one or more sample marks on a sample disposed on the sample chuck, where a particular set of one or more alignment images at a particular location includes at least one alignment image associated with a particular sample mark of the one or more sample marks and further includes at least one alignment image associated with a particular portion of the absolute reference marks within a field of view of the imaging metrology tool visible through the sample. In another illustrative embodiment, the system includes a controller communicatively coupled to the imaging metrology tool. In another illustrative embodiment, the controller determines absolute coordinates of the one or more sample marks based on the sets of one or more alignment images. In another illustrative embodiment, determining the absolute coordinates of the particular sample mark includes determining the absolute coordinates of the particular sample mark based on a position of the particular sample mark relative to the particular portion of the absolute reference marks using the particular set of one or more alignment images.

A method is disclosed in accordance with one or more illustrative embodiments of the present disclosure. In one illustrative embodiment, the method includes placing a sample including one or more sample marks onto a sample chuck with absolute reference marks. In another illustrative embodiment, the method includes determining absolute coordinates of the one or more sample marks based on the absolute reference marks. In another illustrative embodiment, determining the absolute coordinates of a particular sample mark of the one or more sample marks includes translating the sample to place the particular sample mark within a field of view of an imaging metrology tool; capturing one or more alignment images with the imaging metrology tool, where at least one of the one or more alignment images corresponds to the particular sample mark, and where at least one of the one or more alignment images corresponds to a portion of the absolute reference marks within the field of view of the imaging metrology tool visible to the imaging metrology tool through the sample; and determining the absolute coordinates of the particular sample mark based on the one or more alignment images.

A system is disclosed in accordance with one or more illustrative embodiments of the present disclosure. In one illustrative embodiment, the system includes a sample chuck including absolute reference marks. In another illustrative embodiment, the system includes an imaging metrology tool configured to capture sets of one or more alignment images at locations associated with one or more sample marks on two or more samples disposed on the sample chuck, where a particular set of one or more alignment images at a particular location includes at least one alignment image associated with a particular sample mark of the one or more sample marks and further includes at least one alignment image associated with a particular portion of the absolute reference marks within a field of view of the imaging metrology tool. In another illustrative embodiment, the system includes a controller communicatively coupled to the imaging metrology tool and the sample bonder. In another illustrative embodiment, the controller determines absolute coordinates of the one or more sample marks on the two or more samples based on the sets of one or more alignment images. In another illustrative embodiment, determining the absolute coordinates of the particular sample mark includes determining the absolute coordinates of the particular sample mark based on a position of the particular sample mark relative to the particular portion of the absolute reference marks using the particular set of one or more alignment images. In another illustrative embodiment, the system includes a sample bonder, where the sample bonder aligns a first sample of the two or more samples to a second sample of the two or more samples by aligning at least one of the one or more sample marks on the first sample to at least one of the one or more sample marks on the second sample, and where the sample bonder further bonds the first sample to the second sample to form a bonded sample.

A method is disclosed in accordance with one or more illustrative embodiments of the present disclosure. In one illustrative embodiment, the method includes generating absolute placement maps including absolute coordinates of the one or more sample marks for two or more samples. In another illustrative embodiment, the absolute coordinates of a particular sample mark of the one or more sample marks on a particular sample of the two or more samples is generated by translating the particular sample to place the particular sample mark within a field of view of an imaging metrology tool; capturing one or more alignment images with the imaging metrology tool, where at least one of the one or more alignment images corresponds to the particular sample mark, and where at least one of the one or more alignment images corresponds to a portion of the absolute reference marks within the field of view of the imaging metrology tool visible to the imaging metrology tool through the sample; and determining the absolute coordinates of the particular sample mark based on the one or more alignment images.

A multi-plane imaging metrology tool is disclosed in accordance with one or more illustrative embodiments of the present disclosure. In one illustrative embodiment, the tool includes an illumination sub-system to direct illumination from an illumination source to a sample. In another illustrative embodiment, the tool includes a detector. In another illustrative embodiment, the tool includes an imaging sub-system to simultaneously image two or more object planes onto the detector, where a depth of field of the imaging sub-system is smaller than a separation between at least two of the two or more object planes. In another illustrative embodiment, where the imaging sub-system includes an objective lens to collect light from the sample as collection light. In another illustrative embodiment, the imaging sub-system includes one or more beamsplitters, where the one or more beamsplitters split the collection light into two or more conjugate paths and recombine the collection light from the two or more conjugate paths to a common optical path including the detector, and where the two or more conjugate paths have different optical path lengths to simultaneously image the two or more object planes onto the detector.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 7A is a flow diagram illustrating steps performed in a method for sample mapping, in accordance with one or more embodiments of the present disclosure.

FIG. 7B is a flow diagram illustrating steps associated with the step of determining absolute coordinates of the one or more sample marks, in accordance with one or more embodiments of the present disclosure.

FIG. 8 is a flow diagram of a method for sample bonding, in accordance with one or more embodiments of the present disclosure.

DETAILED DESCRIPTION

Figure 1A:
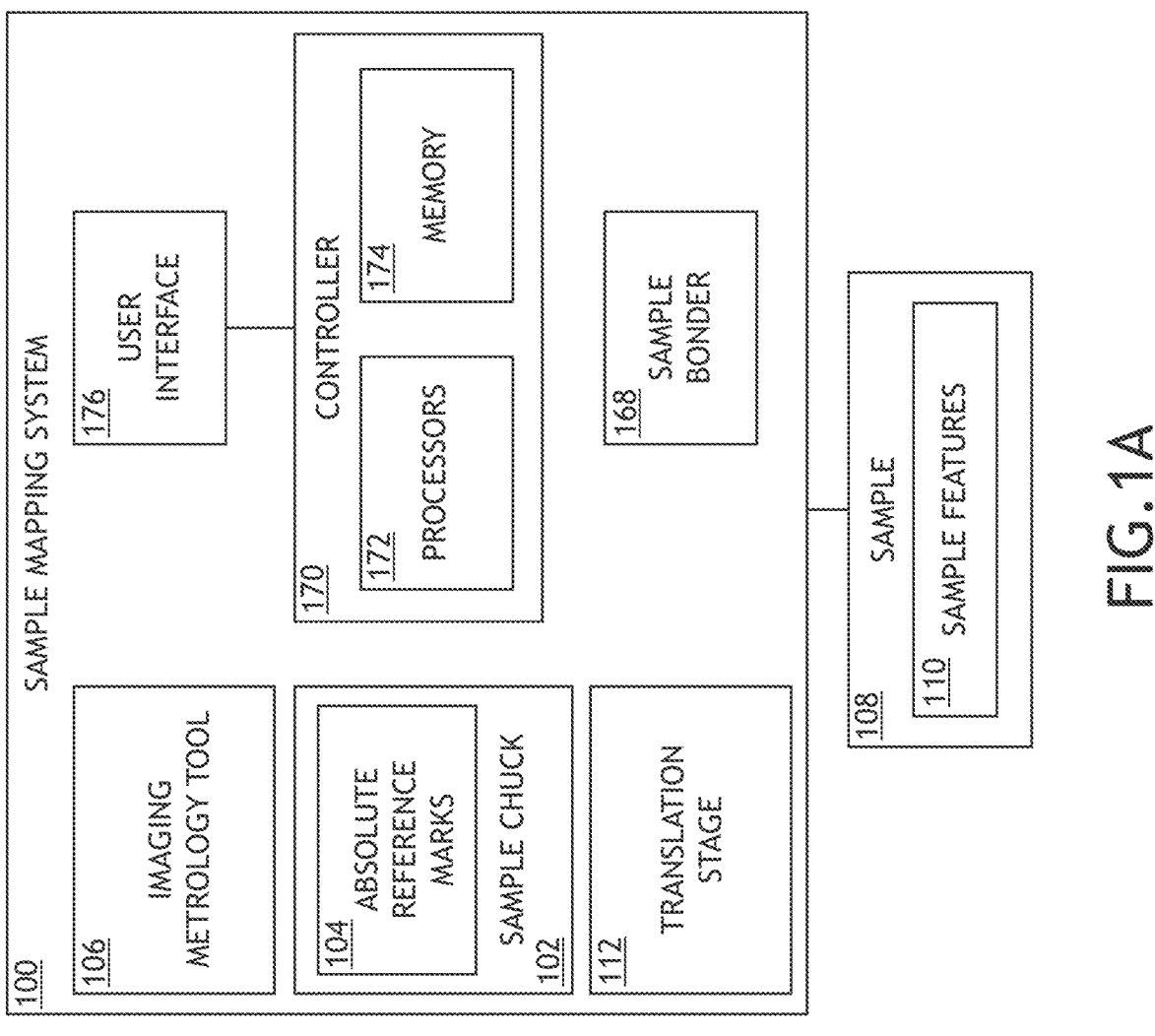
FIG. 1A is a block diagram view of a sample mapping system in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for accurate alignment and/or overlay measurements suitable for advanced packaging schemes such as, but not limited to, wafer-to-wafer (W2 W) or die-to-wafer (D2 W) schemes. It is contemplated herein that such advanced packaging schemes require accurate alignment and/or overlay measurements (e.g., sub-micron or lower accuracies) at numerous stages both pre and post bonding. Prior to bonding, it may be desirable to obtain absolute position maps of features such as, but not limited to, bonding pads, alignment marks, or overlay marks on one or more samples (e.g., wafers, dies, or the like). For example, such absolute position maps may facilitate selection of compatible samples for bonding based on the absolute positions of the features. By way of another example, the absolute position maps of one sample may be used as feed-forward control for the fabrication of features on a second sample to promote accurate alignment. After bonding any two samples, it may be desirable to accurately measure the accuracy of the alignment. For example, an overlay measurement may be performed on an overlay target having features on both samples. It may further be desirable to provide such measurements with a single tool to meet cost and/or throughput requirements.

Traditional techniques may fail to provide the accuracy required to meet increasingly stringent fabrication tolerances. For example, design specifications may have insufficient accuracy since the absolute positions of fabricated sample features may deviate from the designed locations due to various factors such as, but not limited to, alignment or overlay errors during fabrication. By way of another example, it may be impractical or undesirable to provide sample translation stages with a desired accuracy and/or repeatability (e.g., sub-micron accuracy and/or repeatability), particularly for an operational range suitable for measurements of large samples (e.g., full semiconductor wafers, or the like). By way of another example, traditional imaging systems may be unsuitable for capturing highly-resolved measurements of sample features on different imaging planes with high lateral accuracy.

Some embodiments of the present disclosure are directed to a sample mapping system including a sample chuck including absolute reference marks and an imaging metrology tool suitable for generating images associated with both the absolute reference marks and sample marks (e.g., features on the sample for which absolute coordinates are desired). Further, the sample chuck may be mounted to one or more translation stages suitable for positioning a sample within a field of view of the imaging metrology tool. Such a sample mapping system may be suitable for, but is not limited to, generating absolute coordinates (e.g., an absolute position) of sample marks on one or more samples prior to bonding. For example, an absolute position of a particular feature of a sample mounted on the sample chuck may be determined by translating the particular feature to a field of view of an imaging metrology tool and capturing one or more alignment images at this location, where the alignment images at this location include at least one image associated with the sample mark and at least one image associated with a portion of the absolute reference marks in the field of view and visible through the sample. In this way, a highly-accurate position of the particular sample mark may be determined based on a position of the particular sample mark with respect to the absolute reference marks.

The imaging metrology tool may include any metrology tool suitable for generating any combination of field-plane images or pupil-plane images of a sample. For example, field-plane images may be generated by placing a detector at a field plane conjugate to a plane of the sample such that features on the sample are resolved on the resulting image. By way of another example, pupil-plane images may be generated by placing a detector at a pupil plane (e.g., a diffraction plane) such that a resulting image includes an angular distribution of light emanating from the sample. Accordingly, one or more alignment images suitable for determining absolute positions of sample features may include any combination of field-plane images or pupil-plane images.

In some embodiments, an absolute position of the particular sample mark is generated directly from the position of the particular sample mark with respect to the absolute reference marks. In some embodiments, an absolute position of the particular sample mark corresponds to adjustments or corrections to preliminary coordinates (e.g., an expected location) of the particular sample mark. For instance, preliminary coordinates of sample marks may be based on design data, previous measurements, or any suitable technique. Absolute coordinates of sample features may thus be characterized by a combination of the preliminary coordinates and correction coordinates generated using the alignment images. Further, the absolute positions of sample features may include any positional information including, but not limited to, lateral coordinates (e.g., X-Y coordinates), depth coordinates (e.g., Z coordinates), or rotational coordinates (e.g., 8 coordinates).

It is contemplated herein the alignment images may be captured using a variety of techniques. In some cases, a depth of field of the imaging metrology tool may be sufficiently large that the sample marks and absolute reference marks are simultaneously in focus, the imaging metrology tool may generate a single alignment image per sample feature. In other cases, more advanced imaging techniques may be used. In some embodiments, the imaging metrology tool may generate separate images of the sample features and the absolute reference marks. For example, the imaging metrology tool may generate a first image at a first axial position of a translation stage at which the sample marks are at an object plane and a second image at a second axial position of the translation stage at which the absolute reference marks are at the object plane. In some embodiments, the imaging metrology tool is a multi-plane imaging metrology tool suitable for generating a single alignment image in which the sample marks and the absolute reference marks are simultaneously in focus despite an axial separation of these features greater than a depth of field of the imaging metrology tool.

Additional embodiments of the present disclosure are directed to a multi-plane imaging metrology tool suitable for simultaneously imaging features on two object planes that may be separated by a distance greater than a depth of field of the multi-plane imaging metrology tool. In some embodiments, a multi-plane imaging metrology tool includes a common illumination source to illuminate the features on both object planes, a common objective lens to capture light from the features on both object planes, and a common detector to simultaneously image the features from both object planes in a common field of view. The multi-plane imaging metrology tool may further include one or more beamsplitters in an imaging sub-system to provide two conjugate paths with different optical path lengths and to combine the light from the two conjugate paths along a common optical path towards the common detector. In this way, the optical path lengths of the two conjugate paths may be adjusted to provide simultaneous imaging of the two object planes on the common detector. In some embodiments, the multi-plane imaging metrology tool further includes components to isolate light from the object planes into corresponding conjugate paths and/or to suppress light from out-of-focus object planes in the conjugate paths. In this way, out-of-focus light may be minimized or otherwise controlled to acceptable levels. Light from particular object planes may be distinguished based on a variety of techniques including, but not limited to, polarization, wavelength, or collection angle.

It is contemplated herein that a multi-plane imaging metrology tool as disclosed herein may be suitable for alignment and/or overlay measurements of a variety of samples at a variety of stages of fabrication. For example, a multi-plane imaging metrology tool may be suitable for generating absolute position maps of sample features by simultaneously imaging sample features and absolute reference marks. By way of another example, a multi-plane imaging metrology tool may be suitable for alignment of samples to be bonded based on alignment targets including features on each of two samples to be bonded. By way of another example, a multi-plane imaging metrology tool may be suitable for overlay measurements of a bonded sample based on overlay targets including features on each of two samples forming the bonded sample. Further, a multi-plane imaging metrology tool is not limited to applications involving advanced packaging. By way of another example, a multi-plane imaging metrology tool may be suitable for imaging features on multiple layers of a multi-layer structure such as, but not limited to, a multi-layer memory device.

Additional embodiments of the present disclosure are directed to providing process control based on absolute position maps of sample features, alignment measurements, and/or overlay measurements. In some embodiments, absolute position maps of three or more samples are generated and one or more pairs of samples for bonding are selected based on the absolute position maps. In this way, the absolute position maps on fabricated samples (e.g., wafers, dies, or the like) may provide data for determining, at least in part, which samples are compatible for bonding. In some embodiments, an absolute position map for a first sample is used to control the fabrication of a second sample to be bonded to the first sample. For example, the absolute positions of features on the first sample (e.g., bonding pads, alignment marks, overlay marks, or the like) may be used to influence various fabrication steps of the second sample (e.g., lithography steps, or the like) such that the second sample is suitable for bonding with the first sample. In some embodiments, overlay measurements associated with overlay targets formed using sample features on both a first and a second sample to be bonded are used to control an alignment and/or bonding process of the first and second samples. For example, such an overlay measurement may be used to position the first and second samples prior to bonding and/or assess the accuracy or quality of a bond. In some embodiments, overlay measurements associated with overlay targets formed using sample features on both a first and a second sample portions of a bonded sample are used for feedback process control for the fabrication of additional bonded wafers and/or as feed-forward process control for subsequent fabrication steps using the bonded wafer.

Referring now to FIGS. 1-8, systems and methods for advanced packaging control are described in greater detail in accordance with one or more embodiments of the present disclosure.

FIG. 1A is a block diagram view of a sample mapping system 100 in accordance with one or more embodiments of the present disclosure. In some embodiments, the sample mapping system 100 includes a sample chuck 102 with absolute reference marks 104 and an imaging metrology tool 106 suitable for generating alignment images including the absolute reference marks 104 (or a portion thereof within a field of view of the imaging metrology tool 106) as well as features on a sample 108 (e.g., sample marks 110) mounted to the sample chuck 102. In some embodiments, the sample mapping system 100 further includes a translation stage 112 suitable for translating the sample chuck 102 to position a sample mark 110 (or the sample 108 more generally) with respect to a field of view of the imaging metrology tool 106 for the generation of alignment images. For example, the translation stage 112 may include any number or combination of linear actuators, rotational actuators, or angular actuators. In this way, the translation stage 112 may control a lateral position of the sample 108 (e.g., in a plane parallel to a surface of the sample 108 proximate to the imaging metrology tool 106), an axial or focal position of the sample 108, and/or an angular tip/tilt of the sample 108. It is contemplated herein that generating alignment images of sample marks 110 on a sample 108 and absolute reference marks 104 on a sample chuck 102 securing the sample 108 may enable the determination of absolute positions with a higher accuracy and/or repeatability than an accuracy and/or repeatability provided by the translation stage 112 or any associated actuators therein.

In some embodiments, the sample mapping system 100 determines an absolute position of a sample mark 110 by translating the sample mark 110 to a field of view of the imaging metrology tool 106 and capturing one or more alignment images of the absolute reference marks 104 and the sample mark 110 at a common position. The one or more alignment images at this common position may include at least one image captured with a measurement recipe tailored for imaging the sample mark 110 and at least one image captured with a measurement recipe tailored for imaging the absolute reference marks 104. Because the sample 108 is located on the sample chuck 102, the imaging metrology tool 106 may capture images of the absolute reference marks 104 through the sample 108.

A measurement recipe may generally include any configuration of the imaging metrology tool 106, components thereof, or the sample mapping system 100 more generally that is associated with the generation of an image. For example, a measurement recipe may include, but is not limited to, an axial position of the sample 108 (e.g., a position of the sample 108 with respect to an object plane of the imaging metrology tool 106), properties of illumination light directed to the sample 108 (e.g., wavelength, polarization, intensity, azimuth and/or polar illumination angle, or the like), properties of measurement light collected from the sample and used to form an image (e.g., polarization, wavelength, azimuth and/or polar collection angle, or the like), or properties of a detector used to generate an image (e.g., exposure time, or the like). It is contemplated herein that a measurement recipe suitable for imaging a sample mark 110 need not be the same as a measurement recipe suitable for imaging the absolute reference marks 104. Accordingly, the imaging metrology tool 106 may utilize the same or different measurement recipes to image the sample mark 110 and the absolute reference marks 104 at a common position, where the selection of measurement recipes may be governed by the dimensions and/or composition of the sample 108. Further, since the absolute reference marks 104 are located on the sample chuck 102 securing the sample 108, the measurement recipe used to image at least the absolute reference marks 104 may be selected to image the absolute reference marks 104 through the sample 108. For example, the wavelength of illumination may be selected to be transparent to the sample 108, illumination and/or collection angles may be selected to compensate for a thickness of the sample 108, or the like.

The absolute reference marks 104 on the sample chuck 102 may include any markings suitable for providing an absolute reference for the determination of actual positions of sample marks 110 on a sample 108. For example, the absolute reference marks 104 may include any combination of lines, characters (e.g., alphanumeric characters), symbols, or the like that may be imaged by the imaging metrology tool 106 through the sample 108. In this way, absolute positions of the sample marks 110 may be determined based on relative positions of the sample marks 110 and proximate absolute reference marks 104 as determined by the alignment images. Further, absolute positions, or absolute coordinates, may include information regarding the location, orientation, and/or size of the sample marks 110. For example, the absolute coordinates associated with sample marks 110 may be, but are not required to be, represented as a triplet including location and rotation information $(X_i, Y_i, \theta_i)$, where the subscript "i" represents a particular sample mark 110. Further, the absolute coordinates of a sample mark 110 may be associated with any selected location on the sample mark 110 such as, but not limited to, a geometric center of the sample mark 110 or a selected sub-feature. By way of another example, each sample mark 110 may be represented by a set of absolute coordinates associated with selected sub-features (e.g., corners, or the like).

It is contemplated herein that an absolute position (e.g., absolute coordinates) of a sample mark 110 may be provided or generated using a variety of techniques based on alignment images including both the sample mark 110 and absolute reference marks 104. In some embodiments, absolute coordinates of a sample mark 110 are generated directly based on alignment images. For example, the absolute reference marks 104 may have sufficient information that absolute coordinates may be generated directly using alignment images including both the sample mark 110 and the absolute reference marks 104 without additional information. In some embodiments, absolute coordinates of a sample mark 110 are generated based on preliminary coordinates of the sample mark 110 and correction coordinates generated based on alignment images. For example, a preliminary position of a sample mark 110 may be known based on design data, a system recipe, pre-GDS info, or by any other means. Accordingly, absolute coordinates of the sample mark 110 may be determined by positioning the sample 108 at a preliminary location of the sample mark 110, generating alignment images of the sample mark 110 and the absolute reference marks 104 at this location, and determining correction coordinates based on the relative position and/or orientation of the sample mark 110 with respect to the absolute reference marks 104.

Referring now to FIGS. 2A-3E, various nonlimiting examples of absolute reference marks 104 are described in greater detail, in accordance with one or more embodiments of the present disclosure.

In some embodiments, the absolute reference marks 104 include coordinate values associated with a selected coordinate system. The absolute reference marks 104 may further include a coordinate grid including lines and/or curves representing selected coordinate values. The absolute reference marks 104 may generally include coordinate values and/or a coordinate grid associated with any coordinate system including, but not limited to, a Cartesian coordinate system, a polar coordinate system, or the like. It is contemplated herein that absolute reference marks 104 including coordinate values and/or a coordinate grid may be suitable for directly determining absolute coordinates of sample marks 110 and/or for generating correction coordinates.

Various aspects of the sample mapping system 100 such as, but not limited to, a density of the coordinate values and/or the coordinate grid, a field of view of the imaging metrology tool 106, or a resolution of the imaging metrology tool 106 may be designed such that sufficient absolute reference marks 104 are visible in any alignment image to determine an absolute position of a sample mark 110 in the image. For instance, at least two lines of the coordinate grid and/or two coordinate values may be within the field of view of the imaging metrology tool 106 in any direction of interest. Additionally, it may be the case that a sample mark 110 blocks or otherwise obscures a portion of the absolute reference marks 104 underneath the sample mark 110. Accordingly, the various aspects of the sample mapping system 100 may be designed to account for such an expected size (or range of sizes) of sample marks 110 such that sufficient absolute reference marks 104 are visible to provide an absolute position of a sample mark 110 even if the sample mark 110 obscures a portion of absolute reference marks 104.

Figure 2B:
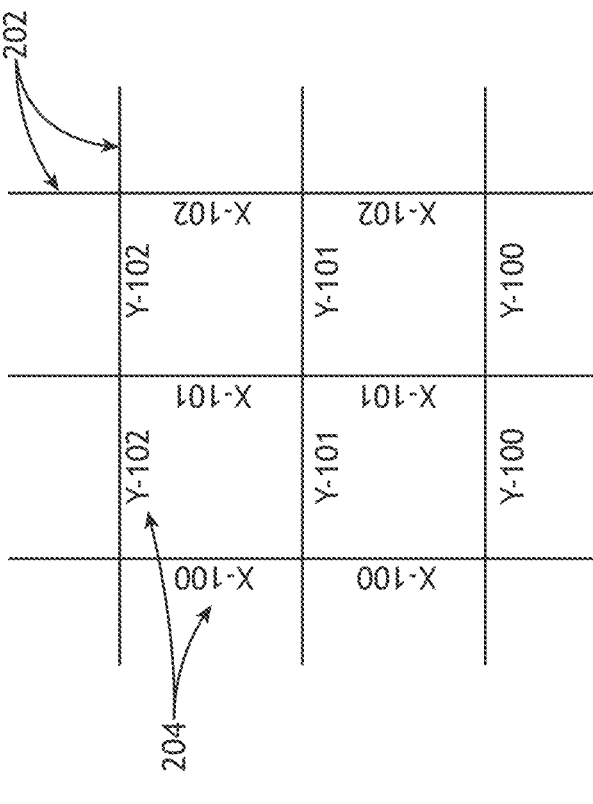
FIG. 2B is a higher magnification view of a selected area of the sample chuck of FIG. 2A illustrating absolute reference marks including coordinate values associated with the coordinate grid, in accordance with one or more embodiments of the present disclosure.
Figure 2A:
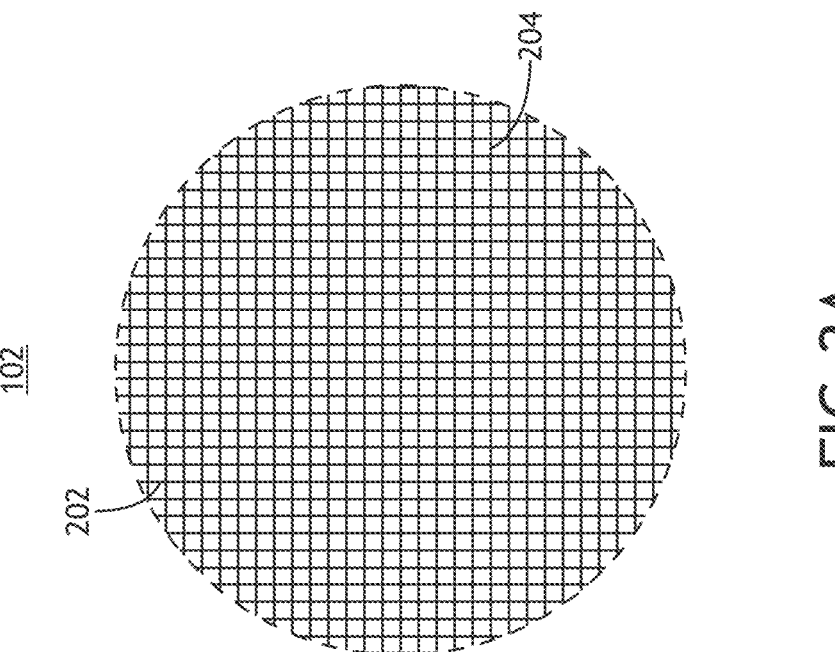
FIG. 2A is a top view of a sample chuck with absolute reference marks including a square coordinate grid, in accordance with one or more embodiments of the present disclosure.

FIG. 2A is a top view of a sample chuck 102 with absolute reference marks 104 including a square coordinate grid 202 (e.g., associated with a Cartesian coordinate system), in accordance with one or more embodiments of the present disclosure. FIG. 2B is a higher magnification view of a selected area of the sample chuck 102 of FIG. 2A illustrating absolute reference marks 104 including coordinate values 204 associated with the coordinate grid 202, in accordance with one or more embodiments of the present disclosure. For example, the coordinate values 204 may include any combination of characters, symbols, or the like that are resolvable by the imaging metrology tool 106 and are associated with proximate lines in the coordinate grid 202. In FIG. 2B, lines of the coordinate grid 202 associated with values along the X axis (e.g., vertical lines) are labeled with coordinate values 204 including an "X" character and a number associated with a value along the X axis (e.g., X-100, X-101, X-102, and the like). Similarly, lines of the coordinate grid 202 associated with values along the Y axis (e.g., horizontal lines) are labeled with coordinate values 204 including a "Y" character and a number associated with a value along the Y axis (e.g., Y-100, Y-101, Y-102, and the like). Further, the coordinate values 204 may be located near the associated lines of the coordinate grid 202 as illustrated in FIG. 2B or on the associated lines of the coordinate grid 202 as illustrated in FIG. 2C below.

Figure 2C:
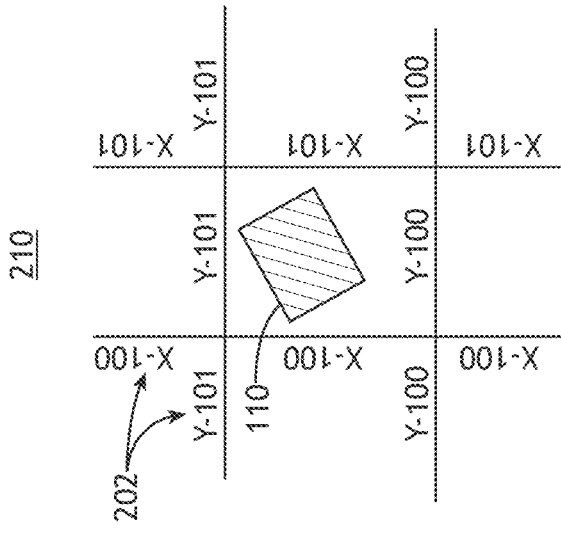
FIG. 2C includes three images of nonlimiting scenarios illustrating the use of absolute reference marks to determine absolute coordinates of a sample mark, in accordance with one or more embodiments of the present disclosure.
Figure 2C:
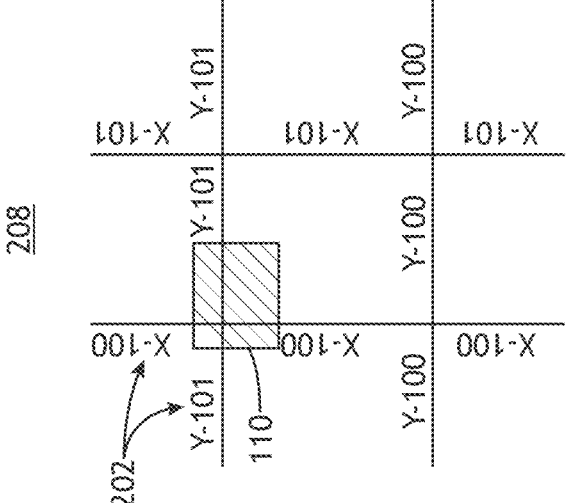
Figure 2C:
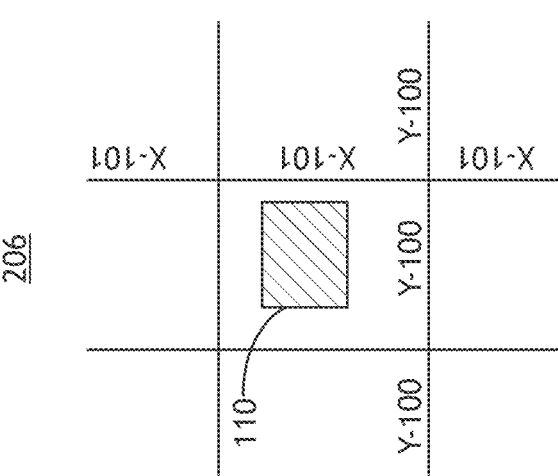

FIG. 2C includes three images of nonlimiting scenarios illustrating the use of absolute reference marks 104 (here, a coordinate grid 202) to determine absolute coordinates of a sample mark 110, in accordance with one or more embodiments of the present disclosure. In the first image 206, a sample mark 110 is located between lines of a coordinate grid 202. In the second image 208, the sample mark 110 partially overlaps lines of the coordinate grid 202 along the X and Y directions. In the third image 210, the sample mark 110 is located between lines of the coordinate grid 202, but is rotated at an angle θ with respect to the coordinate grid 202. In any case, the position of any portion of the sample mark 110 (e.g., a center of the sample mark 110, or the like) may be determined by interpolating between visible absolute reference marks 104.

It is to be understood that FIGS. 2A-2C are provided solely for illustrative purposes and should not be interpreted as limiting. For example, the various absolute reference marks 104 within FIGS. 2A-2C are not illustrated at scale, but are exaggerated for illustrative purposes. By way of another example, the absolute reference marks 104 may include a coordinate grid 202 associated with any coordinate system and/or any suitable coordinate values 204.

In some embodiments, the absolute reference marks 104 include portions of a metrology target (e.g., an overlay target, an alignment target, or the like). For example, absolute reference marks 104 on a sample chuck 102 may form a first portion of a metrology target, and one or more sample marks 110 on a sample 108 may form a second portion of the metrology target. In this way, the alignment images may be analyzed using one or more metrology techniques (e.g., overlay techniques, alignment techniques, or the like) to determine absolute coordinates of the sample marks 110 based on the relative positions of sample marks 110 and absolute reference marks 104.

It is contemplated herein that absolute reference marks 104 and sample marks 110 may be designed to form any type of metrology target known in the art. In some embodiments, absolute reference marks 104 and sample marks 110 form an image-based target in which the absolute reference marks 104 and sample marks 110 are nominally positioned in non-overlapping regions and the relative positions of the absolute reference marks 104 and sample marks 110 may be determined through analysis of one or more field-plane alignment images. For example, image-based targets may include, but are not limited to, box-in-box (BiB) targets, bar-next-to-bar (BnB) targets, advanced imaging metrology (AIM) targets, triple AIM targets, or robust AIM (rAIM) targets. In some embodiments, absolute reference marks 104 and sample marks 110 form a scatterometry-based target in which the absolute reference marks 104 and sample marks 110 are nominally positioned in overlapping regions and the relative positions of the absolute reference marks 104 and sample marks 110 may be determined through analysis of pupil-plane alignment images and/or field-plane alignment images. For example, scatterometry-based targets may include, but are not limited to, grating-over-grating targets in which both the absolute reference marks 104 and certain sample mark 110 are arranged as periodic structures (e.g., diffraction gratings).

Figures 3A, 3B, 3C:
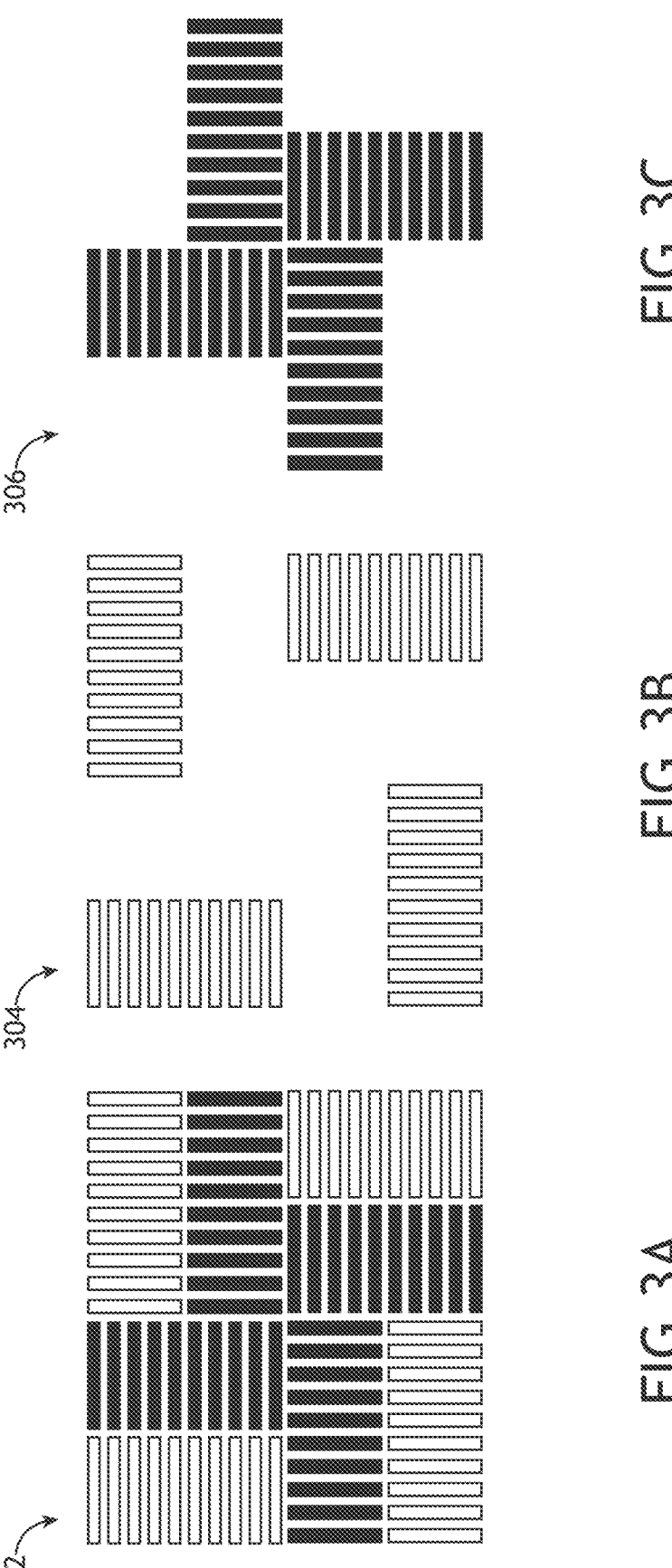
FIG. 3A is a top view of a metrology target formed as an AIM target using first-layer features and second-layer features, in accordance with one or more embodiments of the present disclosure.
FIG. 3B is a top view of the first-layer features of the metrology target in FIG. 3A, in accordance with one or more embodiments of the present disclosure.
FIG. 3C is a top view of the second-layer features of the metrology target in FIG. 3A, in accordance with one or more embodiments of the present disclosure.
Figure 3D:
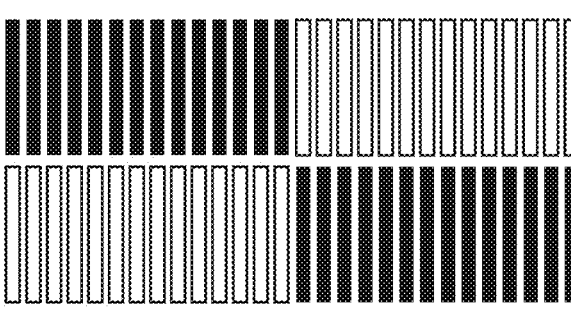
FIG. 3D is a top view of a metrology target providing single-direction measurements along an X direction, in accordance with one or more embodiments of the present disclosure.
Figure 3D:
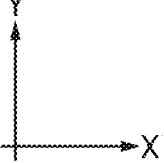
Figure 3E:
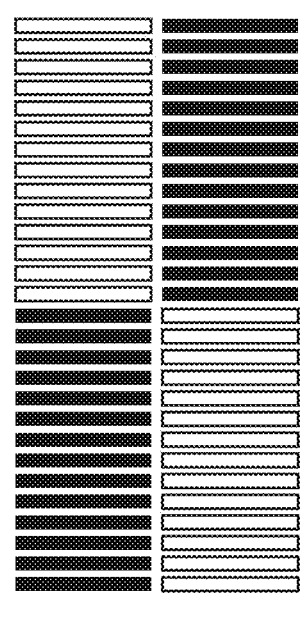
FIG. 3E is a top view of a metrology target providing single-direction measurements along a Y direction, in accordance with one or more embodiments of the present disclosure.
Figure 3E:
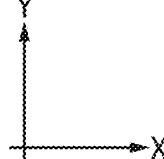

FIG. 3A is a top view of a metrology target 302 formed as an AIM target using first-layer features 304 and second-layer features 306, in accordance with one or more embodiments of the present disclosure. FIG. 3B is a top view of the first-layer features 304 of the metrology target 302 in FIG. 3A, in accordance with one or more embodiments of the present disclosure. FIG. 3C is a top view of the second-layer features 306 of the metrology target 302 in FIG. 3A, in accordance with one or more embodiments of the present disclosure. For example, a sample mark 110 may be formed as a series of sub-features and arranged as either the first-layer features 304 or the second-layer features 306 and a portion of the absolute reference marks 104 may be formed as the other of the first-layer features 304 or the second-layer features 306. Further, the metrology target 302 design illustrated in FIGS. 3A-3B may be suitable for measurements in two orthogonal directions. In some embodiments, a particular metrology target 302 may be suitable for measurements in a single direction. As an illustration, FIG. 3D is a top view of a metrology target 302 providing single-direction measurements along an X direction, in accordance with one or more embodiments of the present disclosure. FIG. 3E is a top view of a metrology target 302 providing single-direction measurements along a Y direction, in accordance with one or more embodiments of the present disclosure. For example, FIG. 3E may correspond to a rotated version of FIG. 3D. In this way, rotated versions of a single-direction metrology target 302 (e.g., as illustrated in FIGS. 3D and 3E) may be fabricated at selected locations to provide for measurements along multiple directions.

It is contemplated herein that any of the various techniques that have been developed in the field of overlay metrology to determine the relative positions of an AIM metrology target 302 as illustrated in FIG. 3A may be used to determine a position of the sample mark 110 relative to the absolute reference marks 104 and thus may be used to determine absolute coordinates of the sample mark 110.

It is further contemplated herein that designing a sample mark 110 and absolute reference marks 104 to form a metrology target may be particularly suitable for, but is not limited to, determining the absolute position of the sample mark 110 based on correction coordinates to be applied to preliminary coordinates as described previously herein.

Referring now generally to FIGS. 1A-3E, absolute reference marks 104 may be implemented in a variety of different ways within the spirit and scope of the present disclosure.

In some embodiments, at least some of the absolute reference marks 104 are formed as permanent or semi-permanent features on the sample chuck 102. For example, absolute reference marks 104 may be formed as painted features. By way of another example, absolute reference marks 104 may be formed through a chemical treatment process (e.g., anodization, or the like). By way of another example, absolute reference marks 104 may be formed as depressions and/or raised features on a layer of the sample chuck 102. By way of another example, absolute reference marks 104 may be formed as reflective features on a transparent foil or sheet on the sample chuck 102.

In some embodiments, at least some of the absolute reference marks 104 are designed to be selectively visible under certain conditions (e.g., conditions associated with a measurement recipe). For example, absolute reference marks 104 may have a wavelength-selective reflectivity (e.g., spectrally-selective reflectivity) in which the reflectivity varies as a function of wavelength. In this way, such absolute reference marks 104 may have a relatively high visibility when illuminated with certain wavelengths and a relatively low visibility otherwise. By way of another example, absolute reference marks 104 may have a polar-ization-selective reflectivity in which the reflectivity varies as a function of polarization of incident illumination. As an illustration, incident illumination on the absolute reference marks 104 with a 90° linear polarization may be reflected with a circular polarization, incident illumination on the absolute reference marks 104 with a 0° linear polarization may be reflected with a 90° linear polarization, or the like.

It is contemplated herein that selectively-visible absolute reference marks 104 may be exploited in various ways to improve the accuracy and/or sensitivity of an absolute position measurement. In some embodiments, the sample mapping system 100 may generate at least one alignment image using a first measurement recipe selected to provide high visibility of the absolute reference marks 104 (e.g., to provide an image under conditions at which the absolute reference marks 104 have a reflectivity above a selected threshold) and at least one alignment image using a second measurement recipe selected to provide relatively low vis-ibility of the absolute reference marks 104 (e.g., to provide an image under conditions at which the absolute reference marks 104 have a reflectivity below a selected threshold). These conditions may further be selected to provide high visibility of the sample mark 110. In some embodiments, the sample mapping system 100 may simultaneously implement a first measurement recipe tailored for imaging a sample mark 110 and a second measurement recipe tailored for imaging absolute reference marks 104, and may further utilize a multi-plane imaging metrology tool 106 to capture a single alignment image of both the sample mark 110 and the absolute reference marks 104 based on the tailored measurement recipes.

Figure 4:
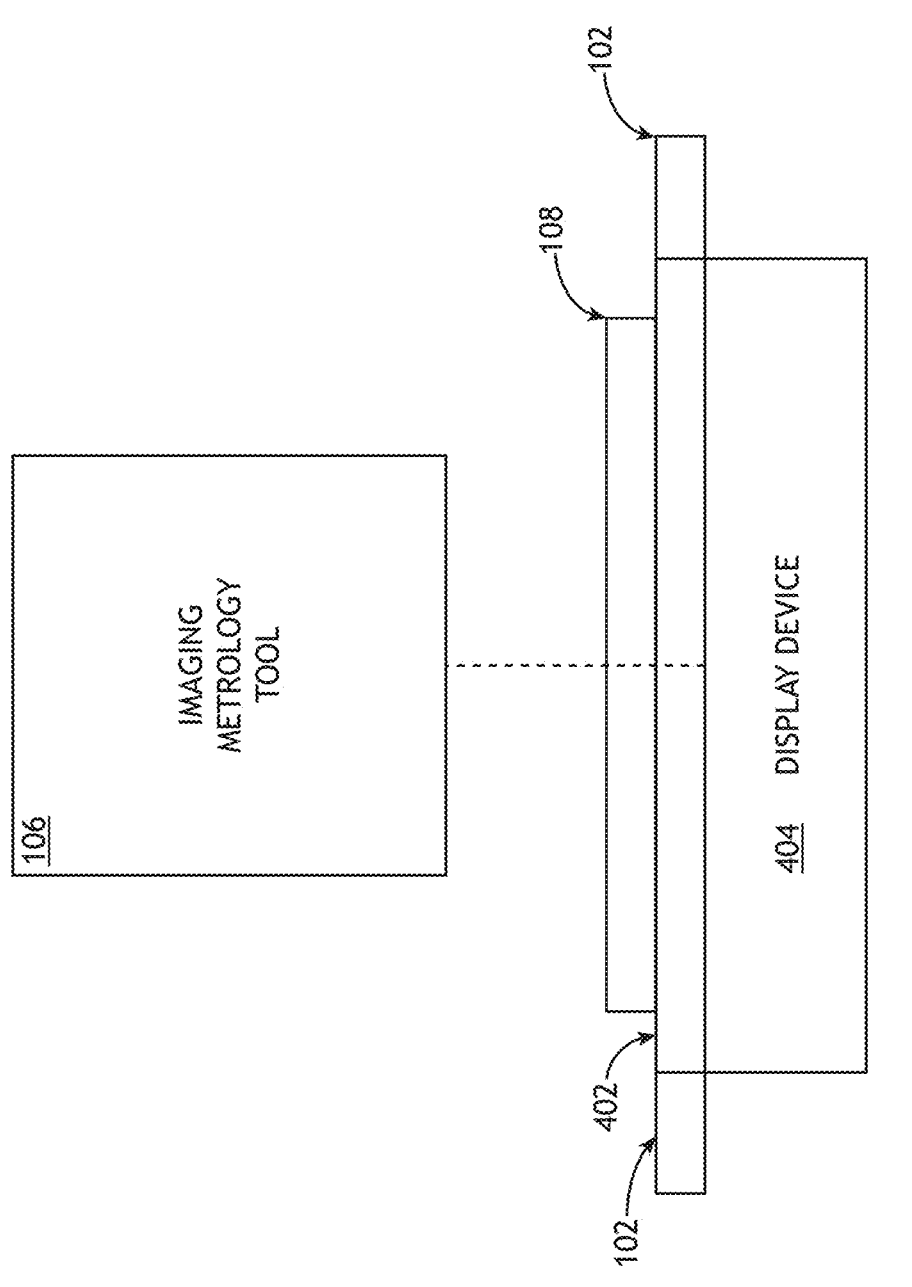
FIG. 4 is a schematic view of a portion of the sample mapping system including sample chuck with a transparent window that is proximate to and supports a sample, a display device below the transparent window, and an imaging metrology tool, in accordance with one or more embodiments of the present disclosure.

In some embodiments, at least some of the absolute reference marks 104 are formed as temporary or dynamic features on the sample chuck 102. For example, the sample chuck 102 may include a sample plate with a transparent window and a display device below the transparent window. In this way, the absolute reference marks 104 may be formed as displayed features on the display device that are visible to the imaging metrology tool 106 through the sample 108 and the transparent portion. FIG. 4 is a schematic view of a portion of the sample mapping system 100 including sample chuck 102 with a transparent window 402 that is proximate to and supports a sample 108, a display device 404 below the transparent window 402, and an imaging metrology tool 106, in accordance with one or more embodiments of the present disclosure. The display device 404 may include any type of display known in the art such as, but not limited to, a liquid crystal display (LCD), a light-emitting diode (LED) display, or an organic LED (OLED) display.

Referring now to FIGS. 1B-1J, various aspects of the imaging metrology tool 106 are described in greater detail in accordance with one or more embodiments of the present disclosure. It is contemplated herein that although the imag-ing metrology tool 106 is described in the context of the sample mapping system 100, the imaging metrology tool 106 may alternatively be provided as a stand-alone device. In this way, the imaging metrology tool 106 as disclosed herein may operate as a stand-alone imaging system suitable for a variety of applications such as, but not limited to, overlay metrology or as an alignment system.

Figure 1B:
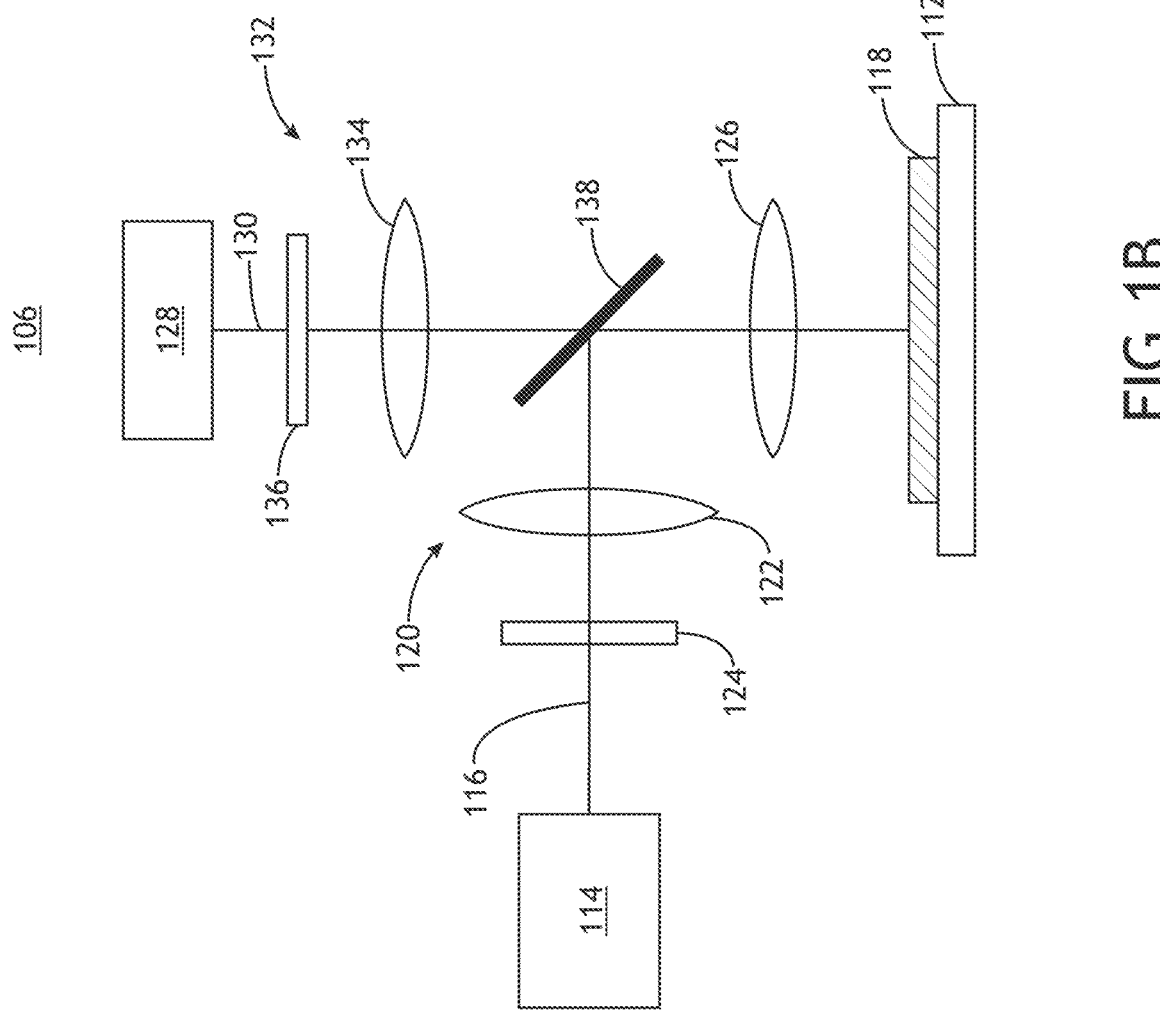
FIG. 1B is a conceptual view illustrating the imaging metrology tool, in accordance with one or more embodiments of the present disclosure.

FIG. 1B is a conceptual view illustrating the imaging metrology tool 106, in accordance with one or more embodi-ments of the present disclosure. In one embodiment, the imaging metrology tool 106 includes an illumination source 114 configured to generate at least one illumination beam 116. The illumination from the illumination source 114 may include one or more selected wavelengths of light including, but not limited to, ultraviolet (UV) radiation, visible radia-tion, or infrared (IR) radiation. For example, the imaging metrology tool 106 may include one or more apertures at an illumination pupil plane to divide illumination from the illumination source 114 into one or more illumination beams 116 or illumination lobes. In this regard, the imaging metrol-ogy tool 106 may provide dipole illumination, quadrature illumination, or the like. Further, the spatial profile of the one or more illumination beams 116 on the sample 108 may be controlled by a field-plane stop to have any selected spatial profile.

The illumination source 114 may include any type of illumination source suitable for providing at least one illu-mination beam 116. In one embodiment, the illumination source 114 is a laser source. For example, the illumination source 114 may include, but is not limited to, one or more narrowband laser sources, a broadband laser source, a super-continuum laser source, a white light laser source, or the like. In this regard, the illumination source 114 may provide an illumination beam 116 having high coherence (e.g., high spatial coherence and/or temporal coherence). In another embodiment, the illumination source 114 includes a laser-sustained plasma (LSP) source. For example, the illumina-tion source 114 may include, but is not limited to, an LSP lamp, an LSP bulb, or an LSP chamber suitable for contain-ing one or more elements that, when excited by a laser source into a plasma state, may emit broadband illumination. In another embodiment, the illumination source 114 includes a lamp source. For example, the illumination source 114 may include, but is not limited to, an arc lamp, a discharge lamp, an electrode-less lamp, or the like. In this regard, the illumination source 114 may provide an illumination beam 116 having low coherence (e.g., low spatial coherence and/or temporal coherence).

The illumination source 114 may provide an illumination beam 116 using free-space techniques and/or optical fibers. In one embodiment, the illumination source 114 generates a multi-lobe illumination beam 116 by providing light in two or more optical fibers, where light output from each optical fiber is an illumination lobe of the illumination beam 116. In another embodiment, the illumination source 114 generates a multi-lobe illumination beam 116 by diffracting a light source into two or more diffraction orders, where the illu-mination lobes of the illumination beam 116 are formed from at least some of the diffraction orders of the light source. Efficient generation of multiple illumination lobes through controlled diffraction is generally described in U.S. Patent Publication No. US2020/0124408 published on Apr. 23, 2020, which is incorporated herein by reference in its entirety.

In another embodiment, the imaging metrology tool 106 directs the illumination beam 116 to an imaging sample 118 via an illumination sub-system 120. The imaging sample 118 may generally include any object or objects to be imaged by the imaging metrology tool 106. For example, in the context of the sample mapping system 100, the imaging sample 118 may include a sample chuck 102 including absolute refer-ence marks 104 and a sample 108 mounted to the sample chuck 102. By way of another example, the imaging sample 118 may include a first sample portion including a first set of alignment features and a second sample portion including a second set of alignment features. In this way, the imaging metrology tool 106 may operate as an alignment tool (e.g., for aligning sample portions to be bonded), or a portion thereof. By way of another example, the imaging sample 118 may include a bonded sample (e.g., a W2 W sample, a D2 W sample, or the like). By way of another example, the imaging sample 118 may include a sample including features on one or more sample layers associated with two or more lithographic exposures. In this way, the imaging sample 118 may operate as an overlay metrology tool, or a portion thereof.

The illumination sub-system 120 may include one or more optical components suitable for modifying and/or conditioning the illumination beam 116 as well as directing the illumination beam 116 to the sample 108. In one embodiment, the illumination sub-system 120 includes one or more illumination sub-system lenses 122 (e.g., to collimate the illumination beam 116, to relay pupil and/or field planes, or the like). In another embodiment, the illumination sub-system 120 includes one or more illumination sub-system control optics 124 to shape or otherwise control the illumination beam 116. For example, the illumination sub-system control optics 124 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In another embodiment, the imaging metrology tool 106 includes an objective lens 126 to focus the illumination beam 116 onto the sample 108. In another embodiment, the sample 108 is disposed on the translation stage 112 suitable for securing the sample 108 and further configured to position the sample 108 with respect to the illumination beam 116.

In another embodiment, the imaging metrology tool 106 includes one or more detectors 128 configured to capture light or other radiation emanating from the sample 108 (e.g., collection light 130) through an imaging sub-system 132. The imaging sub-system 132 may include one or more optical elements suitable for modifying and/or conditioning the collection light 130 from the sample 108. In one embodiment, the imaging sub-system 132 includes one or more imaging sub-system lenses 134 (e.g., to collimate the illumination beam 116, to relay pupil and/or field planes, or the like), which may include, but is not required to include, the objective lens 126. In another embodiment, the imaging sub-system 132 includes one or more imaging sub-system control optics 136 to shape or otherwise control the collection light 130. For example, the imaging sub-system control optics 136 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

A detector 128 may be located at any selected location within the imaging sub-system 132. In one embodiment, the imaging metrology tool 106 includes a detector 128 at a field plane (e.g., a plane conjugate to the sample 108) to generate a field-plane image of the sample 108. In another embodiment, the imaging metrology tool 106 includes a detector 128 at a pupil plane (e.g., a diffraction plane) to generate a pupil-plane image. In this regard, the pupil image may correspond to an angular distribution of light from the sample 108. For instance, diffraction orders associated with diffraction of the illumination beam 116 from the sample 108 (e.g., a sample mark 110 on the sample 108) may be imaged or otherwise observed in the pupil plane. In a general sense, a detector 128 may capture any combination of reflected (or transmitted), scattered, or diffracted light from the sample 108. Further, various imaging sub-system control optics 136 may be located within a pupil plane to select, filter, modify, or otherwise control which portion of an angular distribution of collection light 130 is used to form an image (either a field-plane image or a pupil-plane image). It is contemplated herein that such a configuration may be used to select specific diffraction orders from periodic structures on the imaging sample 118 to be propagated to the detector 128 to form an image (either a field-plane image or a pupil-plane image).

The imaging metrology tool 106 may generally include any number or type of detectors 128 suitable for capturing light from the sample 108. In one embodiment, the detector 128 includes one or more detectors 128 suitable for characterizing a static sample. In this regard, the imaging metrology tool 106 may operate in a static mode in which the sample 108 is static during a measurement. For example, a detector 128 may include a two-dimensional pixel array such as, but not limited to, a charge-coupled device (CCD) or a complementary metal-oxide semiconductor (CMOS) device. In this regard, the detector 128 may generate a two-dimensional image (e.g., a field-plane image or a pupil-plan image) in a single measurement.

In one embodiment, the detector 128 includes one or more detectors 128 suitable for characterizing a moving sample (e.g., a scanned sample). In this regard, the imaging metrology tool 106 may operate in a scanning mode in which the sample 108 is scanned with respect to a measurement field during a measurement. For example, the detector 128 may include a 2D pixel array with a capture time and/or a refresh rate sufficient to capture one or more images during a scan within selected image tolerances (e.g., image blur, contrast, sharpness, or the like). By way of another example, the detector 128 may include a line-scan detector to continuously generate an image one line of pixels at a time. By way of another example, the detector 128 may include a time-delay integration (TDI) detector. A TDI detector may generate a continuous image of the sample 108 when the motion of the sample 108 is synchronized to charge-transfer clock signals in the TDI detector. In particular, a TDI detector acquires charge from light exposure on columns of pixels and includes clock pulses to transfer charge between adjacent columns of pixels along a scan direction. When the motion of the sample 108 along the scan direction is synchronized to the charge transfer in the TDI detector, charge continuously accumulates during the scan. This process continues until the charge reaches a final column of pixels and is subsequently read out of the detector. In this way, images of the object are accumulated over a longer time frame than would be possible with a simple line scan camera. This relatively longer acquisition time decreases the photon noise level in the image. Further, synchronous motion of the image and charge prevents blurring in the recorded image.

The illumination sub-system 120 and the imaging sub-system 132 of the imaging metrology tool 106 may be oriented in a wide range of configurations suitable for illuminating the sample 108 with the illumination beam 116 and collecting light emanating from the sample 108 in response to the incident illumination beam 116. For example, as illustrated in FIG. 1B, the imaging metrology tool 106 may include a beamsplitter 138 oriented such that a common objective lens 126 may simultaneously direct the illumination beam 116 to the sample 108 and collect light from the sample 108 (e.g., the collection light 130). By way of another example, the illumination sub-system 120 and the imaging sub-system 132 may contain non-overlapping optical paths.

Referring now generally to FIG. 1A, it is contemplated herein that in the context of absolute position mapping, a sample mark 110 on a sample 108 and absolute reference marks 104 on a sample chuck 102 may generally be separated by any distance along an axial direction (e.g., a Z direction). As an illustration, the sample 108 may include a substrate and one or more sample layers on which sample marks 110 may be formed. In this case, the sample marks 110 and the absolute reference marks 104 may be separated along the axial direction by at least the thickness of the substrate. In a general sense, the sample 108 may include a substrate of any material or any thickness. For instance, the sample 108 may include, but is not limited to, a substrate formed from a grinded or an ungrinded semiconductor wafer.

It is further contemplated herein that the imaging metrology tool 106 may generate images based on light emanating from within a depth of focus (DOF) surrounding an object plane, which is generally controlled by the numerical aperture of the objective lens 126. For example, features located within the DOF surrounding an object plane will be in focus in an associated field-plane image, whereas features outside the DOF are generally out-of-focus to varying amounts.

The imaging metrology tool 106 disclosed herein may be suitable for generating images of features on multiple planes that may be separated by distances smaller than or larger than the DOF.

As an illustration, in the context of determining absolute positions of sample marks 110, the sample marks 110 may be on a first plane and the absolute reference marks 104 may be on a second plane. In cases where a sample mark 110 and absolute reference marks 104 are both within the DOF of the imaging metrology tool 106 (e.g., the first and second planes are separated by a distance smaller than the DOF), the imaging metrology tool 106 may generate a single alignment image suitable for determining the absolute position of the sample mark 110. However, multiple alignment images generated with multiple measurement recipes may still be generated to increase the accuracy and/or sensitivity of the measurement. In cases where a sample mark 110 and absolute reference marks 104 are not within the DOF of the imaging metrology tool 106 (e.g., the first and second planes are separated by a distance greater than the DOF), the imaging metrology tool 106 may generate at least one alignment image with the sample mark 110 at an object plane of the imaging metrology tool 106 and at least one alignment image with the absolute reference marks 104 at an object plane of the imaging metrology tool 106. In this way, at least one alignment image may be generated with a metrology recipe tailored for the sample mark 110 and at least one alignment image may be generated with a metrology recipe tailored for the absolute reference marks 104.

In some embodiments, the imaging metrology tool 106 includes a single object plane. In this case, the imaging metrology tool 106 may generate images of features located on different planes at a common lateral location by translating an imaging sample 118 along an axial direction and generating separate images at selected axial locations. For example, in the context of the sample mapping system 100, the sample mapping system 100 may generate at least one alignment image after placing a sample mark 110 at the object plane with the translation stage 112 and may further generate at least one alignment image after placing the absolute reference marks 104 at the object plane with the translation stage 112.

In some embodiments, the imaging metrology tool 106 is a multi-plane imaging metrology tool 106 including multiple (e.g., two or more) object planes that may be separated by an axial distance larger than the DOF. In this way, an image generated by the imaging metrology tool 106 is associated with light from multiple separate object planes. For example, features on each of the object planes may be simultaneously in focus on a field-plane image generated by a multi-plane imaging metrology tool 106. A multi-plane imaging metrology tool 106 may thus capture a single alignment image in which both a sample mark 110 on a sample 108 and absolute reference marks 104 on a sample chuck 102 are simultaneously in focus.

Referring now to FIGS. 1C-1K, various configurations of a multi-plane imaging metrology tool 106 are described in greater detail, in accordance with one or more embodiments of the present disclosure. It is noted that the configurations of a multi-plane imaging metrology tool 106 illustrated in FIGS. 1C-1K depict field-plane imaging configurations in which a detector 128 is located in a plane conjugate to the imaging sample 118. However, it is to be understood that this is solely for illustrative purposes and that pupil-plane imaging configurations in which a detector 128 is located in a pupil plane are also within the spirit and scope of the present disclosure.

In some embodiments, a multi-plane imaging metrology tool 106 includes one or more conjugate-path beamsplitters 140 in an imaging sub-system 132 to split collection light 130 along two or more conjugate paths 142 with different optical path lengths and to further recombine the collection light 130 from each of the conjugate paths 142 to a common detection path 144 including the detector 128. It is contemplated herein that for a detector 128 at a fixed location (e.g., a fixed image plane location), the location of an object plane with respect to the objective lens 126 depends on the optical path length between the detector 128 and the objective lens 126. Accordingly, each conjugate path 142 is associated with a different object plane and features in each object plane are simultaneously in focus on the detector 128.

Figure 1C:
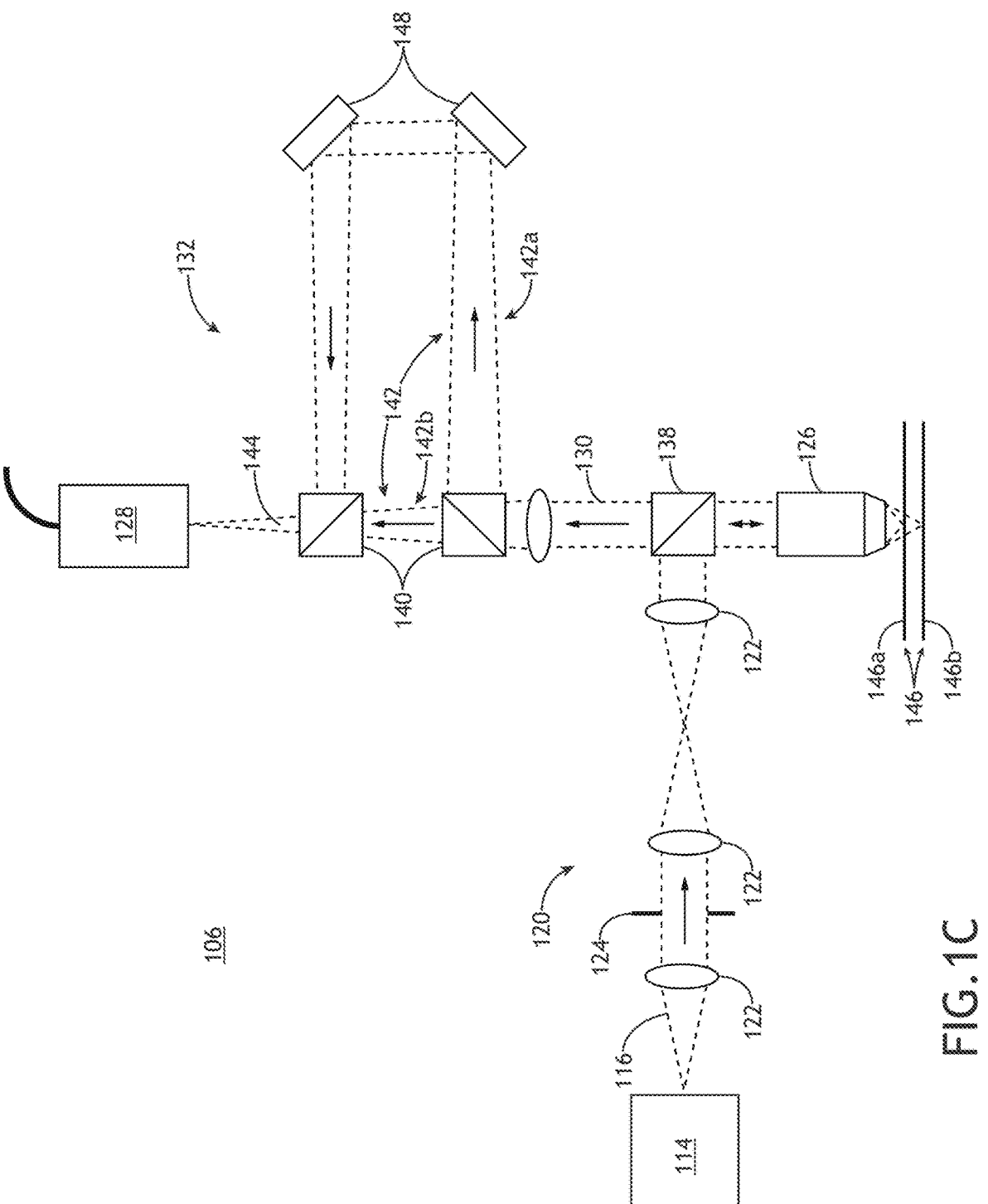
FIG. 1C is a conceptual view of a two-plane imaging metrology tool utilizing two conjugate-path beamsplitters, in accordance with one or more embodiments of the present disclosure.

FIG. 1C is a conceptual view of a two-plane imaging metrology tool 106 utilizing two conjugate-path beamsplitters 140, in accordance with one or more embodiments of the present disclosure. In FIG. 1C, a first conjugate beamsplitter 140*a* splits the collection light 130 into a first conjugate path 142*a* and a second conjugate path 142*b* and a second conjugate beamsplitter 140*b* recombines the light from the two conjugate paths 142*a,b* along the common detection path 144. As a result, the imaging metrology tool 106 has a first object plane 146*a* associated with the first conjugate path 142*a* and a second object plane 146*b* associated with the second conjugate path 142*b*. Each of the conjugate paths 142 may further include various path-control optics 148 or other optical components (not shown) to manipulate and/or modify the collection light 130 within the associated conjugate paths 142.

The conjugate-path beamsplitters 140 may include any component known in the art suitable for splitting the collection light 130 into the conjugate paths 142 and/or combining the light from the conjugate paths 142 to the common detection path 144. Further, the first conjugate beamsplitter 140*a* need not be the same type or configuration of device as the second conjugate beamsplitter 140*b*.

The conjugate-path beamsplitters 140 may split and/or combine the collection light 130 using any technique or mechanism known in the art. Further, the conjugate-path beamsplitters 140 may, but are not required to, discriminate between collection light 130 associated with the various object planes 146.

In some embodiments, the conjugate-path beamsplitters 140 include amplitude beamsplitters (e.g., 50/50 beamsplitters, or the like). In this case, the conjugate-path beamsplitters 140 may not discriminate between collection light 130 associated with the object planes 146 and each of the conjugate paths 142 may include light from each of the object planes 146. It is recognized herein that in this configuration, the detector 128 may receive in-focus light associated with features on the first object plane 146a from the first conjugate path 142a and out-of-focus light associated with the features on the first object plane 146a from the second conjugate path 142b. Similarly, the detector 128 may receive in-focus light associated with features on the second object plane 146b from the second conjugate path 142b and out-of-focus light associated with the features on the second object plane 146a from the first conjugate path 142a. However, the degree to which out-of-focus light impacts a quality (e.g., a contrast, or the like) in the generated image may depend on factors such as, but not limited to, a lateral separation of the features on the different object planes 146 or an axial separation of the different object planes 146. In some cases, the quality of the generated image may be within selected tolerances despite the present of out-of-focus light.

In some embodiments, the conjugate-path beamsplitters 140 and/or additional elements in one or more of the conjugate paths 142 mitigate the presence of out-of-focus light on the detector 128.

In some embodiments, one or more of the conjugate-path beamsplitters 140 are spectrally-selective elements. For example, one or more of the conjugate-path beamsplitters 140 include a spectrally-selective coating (e.g., a dichroic coating, or the like) such that the conjugate paths 142 include light with different spectral content. It is contemplated herein that spectrally-selective conjugate paths 142 may mitigate out-of-focus light on the detector 128 from features on the various object planes 146, particularly when the features on the object planes 146 also have spectrally-selective properties. As an illustration in the context of the sample mapping system 100, the sample marks 110 located on the first object plane 146a and/or the absolute reference marks 104 located on the second object plane 146b may be designed to be reflective in different spectral bands. In this case, the conjugate-path beamsplitters 140 may distinguish between the different spectral bands (e.g., reflect one and transmit the other) such that collection light 130 from the sample marks 110 is limited to the first conjugate path 142a and collection light 130 from the absolute reference marks 104 is limited to the second conjugate path 142b. As a result, the imaging sub-system 132 may provide only the in-focus light of the sample marks 110 and the absolute reference marks 104 to the detector 128.

In some embodiments, one or more of the conjugate-path beamsplitters 140 are polarization-selective elements. It is contemplated that out-of-focus light from features on the various object planes 146 may be similarly mitigated based on polarized conjugate-path beamsplitters 140, particularly when the features on the object planes 146 also have polarization-selective properties. In a general sense, these concepts may be extended to provide mitigation of out-offocus light from features on the various object planes 146 based on conjugate-path beamsplitters 140 with various types of selectivity.

Figure 1D:
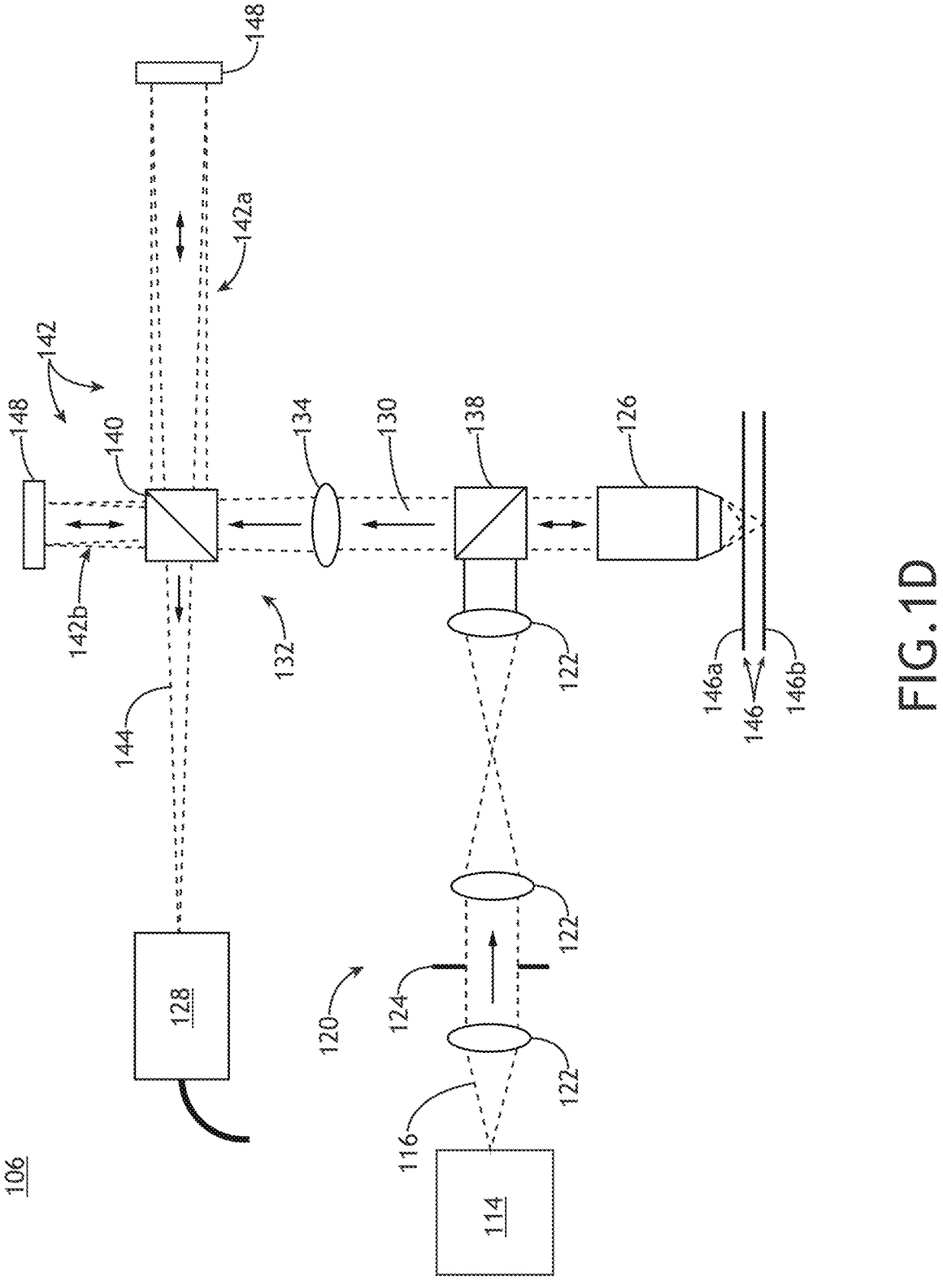
FIG. 1D is a conceptual view of a two-plane imaging metrology tool utilizing a single conjugate beamsplitter 140, in accordance with one or more embodiments of the present disclosure.

Referring now to FIG. 1D, FIG. 1D is a conceptual view of a two-plane imaging metrology tool 106 utilizing a single conjugate beamsplitter 140, in accordance with one or more embodiments of the present disclosure. In FIG. 1D, each conjugate path 142a, b has path-control optics 148 to retroreflect collection light 130 back to the single conjugate beamsplitter 140. It is contemplated herein that the use of a single conjugate beamsplitter 140 and retroreflected collection light 130 in this configuration may increase stability of image-to-image registration. However, such a configuration may utilize only amplitude-selective conjugate-path beamsplitters 140 and may thus provide less ability to mitigate out-of-focus light from features on the various object planes 146.

Figure 1E:
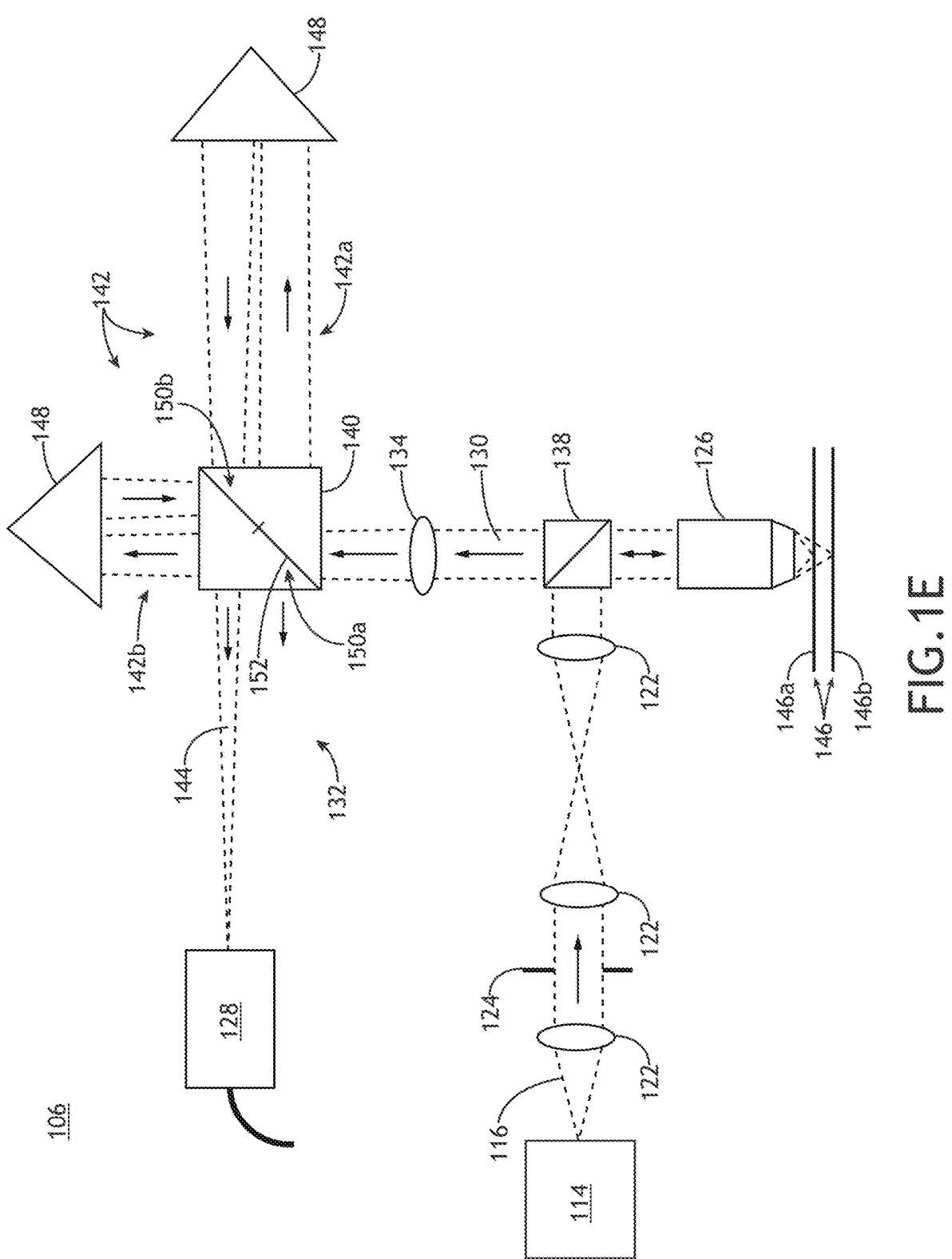
FIG. 1E is a conceptual view of a two-plane imaging metrology tool utilizing a single compound conjugate beamsplitter in an offset configuration, in accordance with one or more embodiments of the present disclosure.

Referring now to FIG. 1E, FIG. 1E is a conceptual view of a two-plane imaging metrology tool 106 utilizing a single compound conjugate beamsplitter 140 in an offset configuration, in accordance with one or more embodiments of the present disclosure. In FIG. 1E, the single compound conjugate beamsplitter 140 includes two coatings 150a,b on different portions of a common face 152. In this case, the collection light 130 from the objective lens 126 may be directed to a first coating 150a, which may split the collection light 130 into the conjugate paths 142a,b. Redirection optics 148 in each conjugate path 142a,b may direct the collection light 130 to a second coating 150b to be recombined to the common detection path 144. In this way, the coatings 150a,b may provide any type of selectivity (e.g., amplitude, spectrum, polarization, or the like) similar to FIG. 1C. Further, the configuration in FIG. 1E may further provide relatively high image-to-image stability through the use of a single-element conjugate beamsplitter 140 and retroreflected collection light 130. The redirection optics 148 may be formed using any technique in the art. In some embodiments, the redirection optics 148 are formed as corner cubes providing three reflections or three mirrors in a corner-cube configuration. In some embodiments, the redirection optics 148 are formed as right prisms providing two reflections or two mirrors in a right prism configuration.

Referring now to FIGS. 1F-1J, in some embodiments, a multi-plane imaging metrology tool 106 includes a dark-field pupil stop 154 to selectively distribute collection light 130 from different object planes 146 to different conjugate paths 142 to mitigate out-of-focus light from the features on the various object planes 146.

Figure 1F:
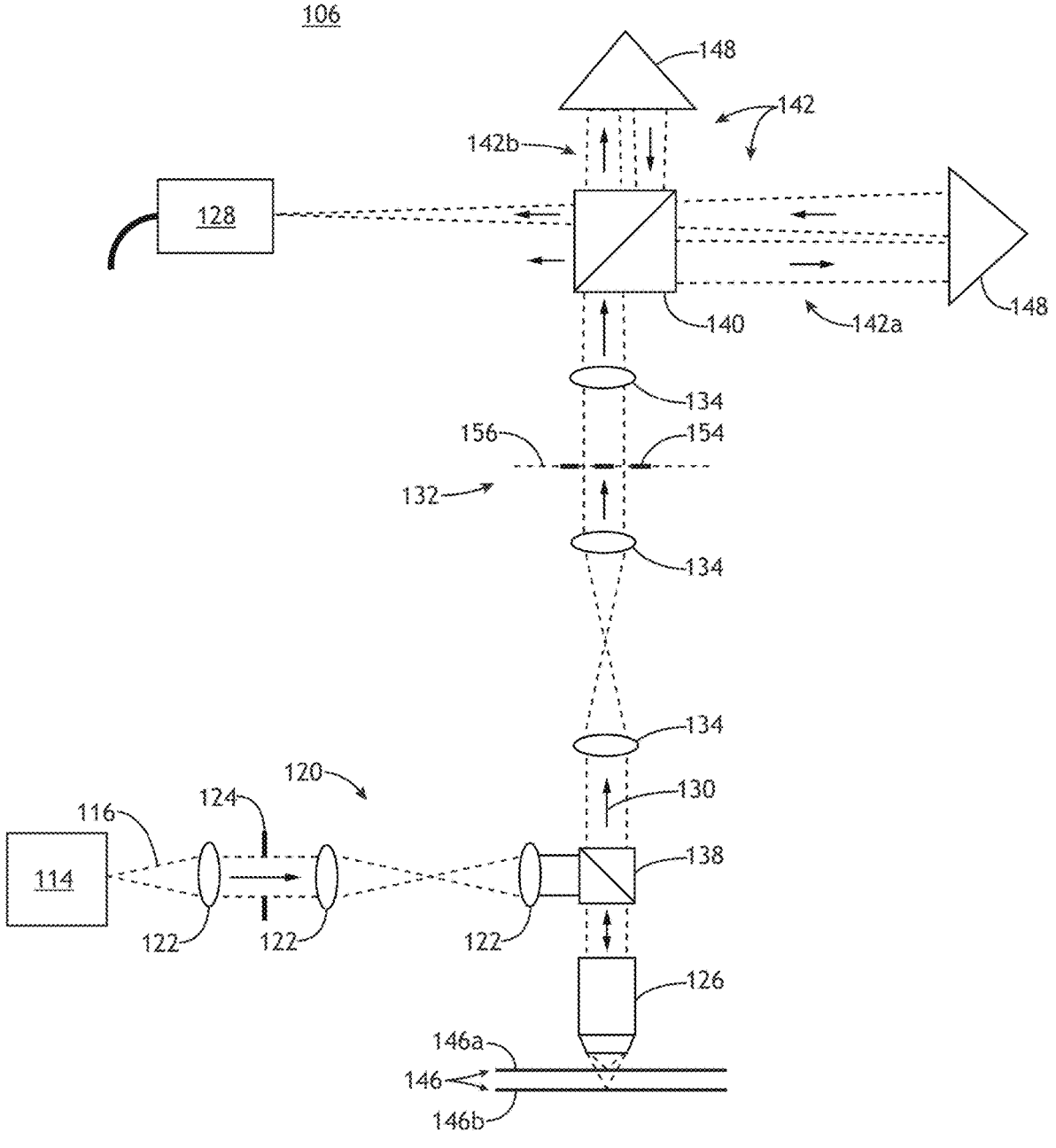
FIG. 1F is a conceptual view of a two-plane imaging metrology tool including a dark-field pupil stop, in accordance with one or more embodiments of the present disclosure.

FIG. 1F is a conceptual view of a two-plane imaging metrology tool 106 including a dark-field pupil stop 154, in accordance with one or more embodiments of the present disclosure. In FIG. 1F, the dark-field pupil stop 154 is located at a pupil plane 156 located between the objective lens 126 and a single compound conjugate-path beamsplitters 140 as illustrated in FIG. 1E, in accordance with one or more embodiments of the present disclosure. The dark-field pupil stop 154 may thus selectively pass (and block) collection light 130 based on the emanation angle from the imaging sample 118.

In some embodiments, the dark-field pupil stop 154 includes an annular aperture and features on the object planes 146a,b are designed with periodic features having different pitches such that illumination with an illumination beam 116 having a narrow angular extent results in spatially-confined diffraction orders for each illumination wavelength in the pupil plane 156. In this configuration, differences between the pitches of the features in the different object planes 146a,b result in spatially-separated diffraction orders at any given wavelength. In some embodiments, the dark-field pupil stop 154, pitches of features on the object planes 146a,b, and the illumination wavelengths are designed such that a diffraction order (e.g., +/−1 diffraction) from the first object plane 146a is passed for a first wavelength and a diffraction order from the second object plane 146b is passed for a second wavelength. The coatings 150a,b of the single compound conjugate beamsplitter 140 may then selectively direct collection light 130 from the first object plane 146a to the first conjugate path 142a and collection light 130 from the second object plane 146b to the second conjugate path 142b. As a result, out-of-focus light from the features on the object planes 146a,b may be suppressed.

FIGS. 1G-1J further provide a nonlimiting example of the use of a dark-field pupil stop 154 for channel selection for an imaging sample 118 such as, but not limited to, designs in accordance with FIGS. 3A-3E.

Figure 1H:
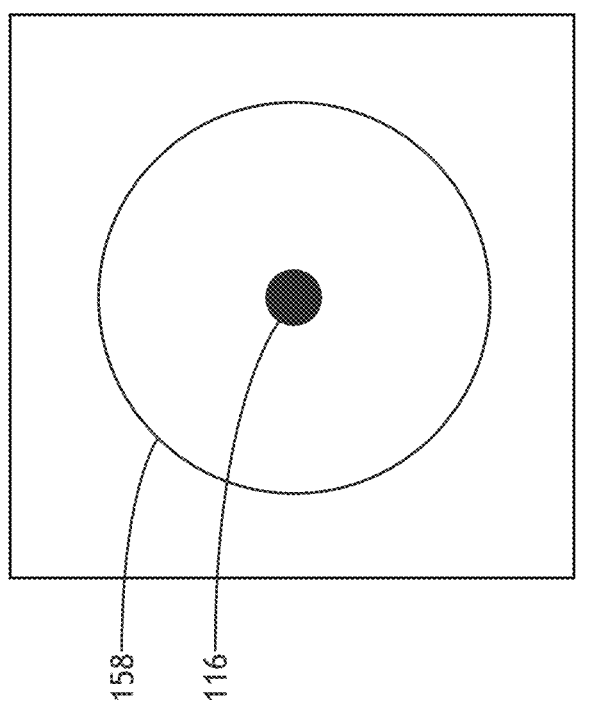
FIG. 1H is a top view of an illumination pupil illustrating normal incidence with a single illumination beam with a narrow angular extent, in accordance with one or more embodiments of the present disclosure.
Figure 1G:
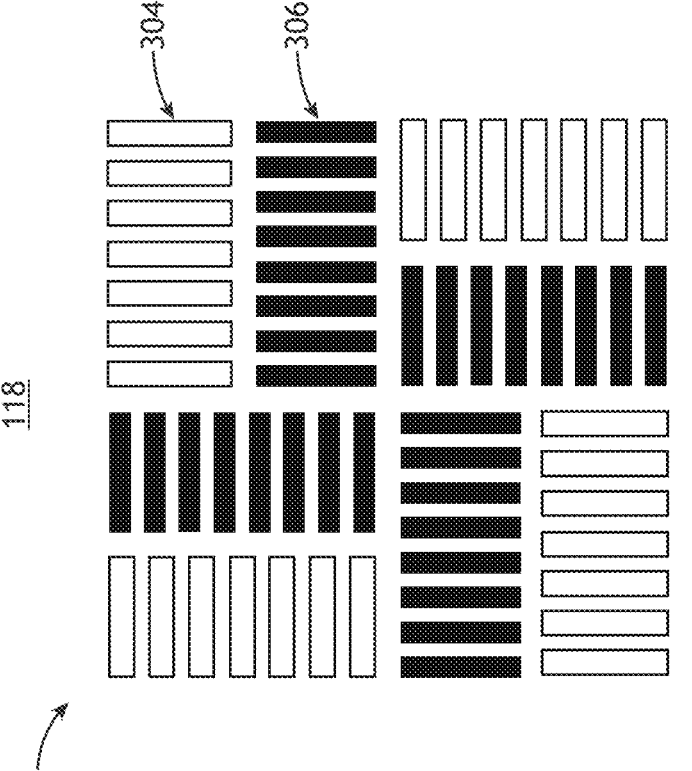
FIG. 1G is a top view of an imaging sample illustrating first-layer features with a first pitch and second-layer features with a second pitch, in accordance with one or more embodiments of the present disclosure.

FIG. 1G is a top view of an imaging sample 118 illustrating first-layer features 304 with a first pitch D1 and second-layer features 306 with a second pitch D2, in accordance with one or more embodiments of the present disclosure. In FIG. 1G, the first pitch is greater than the second pitch.

FIG. 1H is a top view of an illumination pupil 158 illustrating normal incidence with a single illumination beam 116 with a narrow angular extent, in accordance with one or more embodiments of the present disclosure. In this way, the imaging sample 118 may generate discrete diffraction orders in response to the illumination beam 116.

Figure 1J:
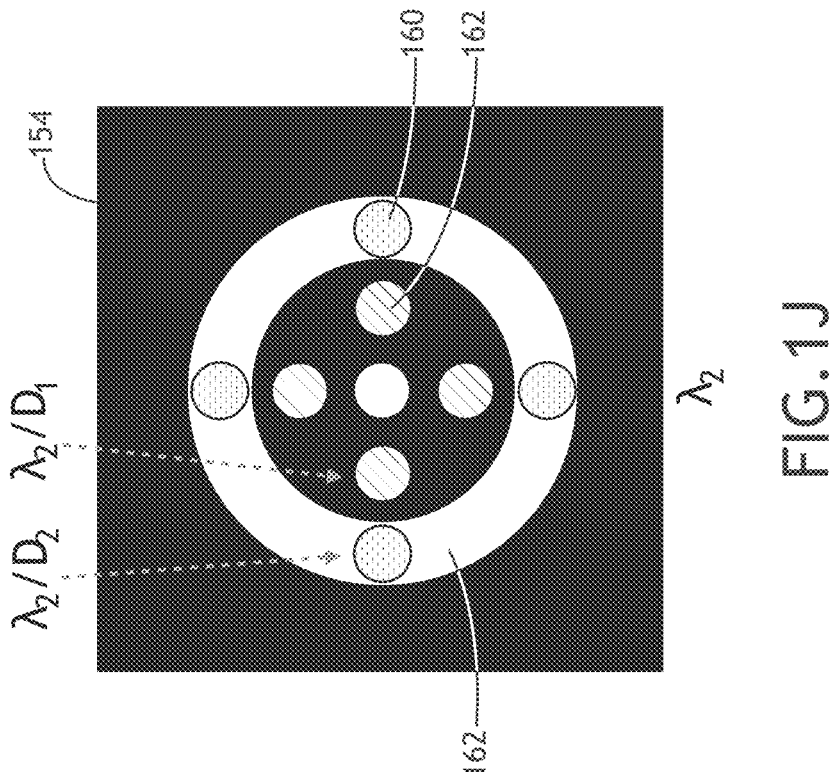
FIG. 1J is a top view of a dark-field pupil stop at a collection pupil plane illustrating 0-order diffraction, first-order diffraction of the first-layer features at a second wavelength, and first-order diffraction of the second-layer features at the second wavelength, in accordance with one or more embodiments of the present disclosure.
Figure 1I:
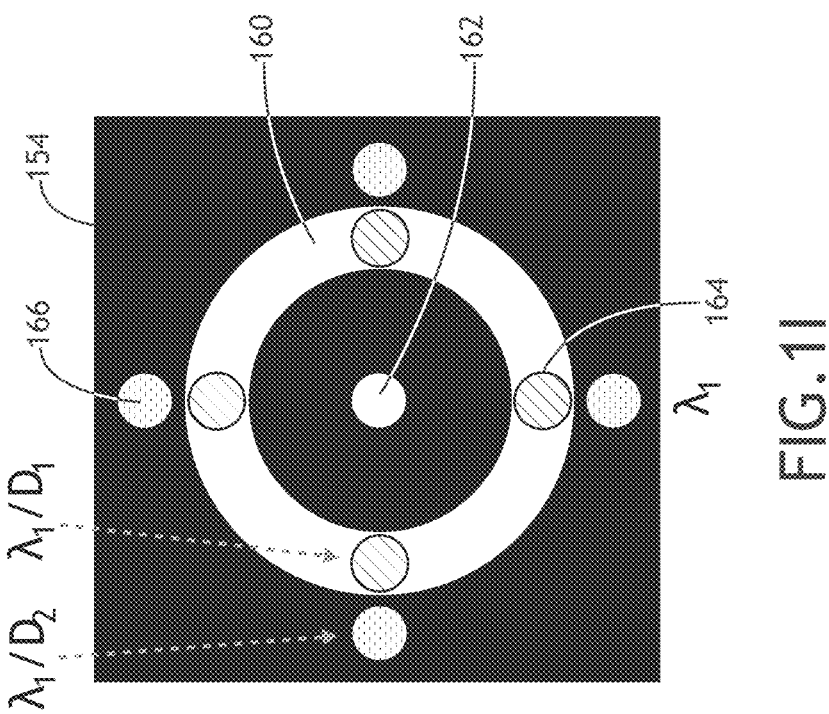
FIG. 1I is a top view of a dark-field pupil stop with an annular aperture at a collection pupil plane illustrating 0-order diffraction, first-order diffraction of the first-layer features at a first wavelength, and first-order diffraction of the second-layer features at the first wavelength, in accordance with one or more embodiments of the present disclosure.

FIG. 1I is a top view of a dark-field pupil stop 154 with an annular aperture 160 at a collection pupil plane 156 illustrating 0-order diffraction 162, first-order diffraction 164 of the first-layer features 304 at a first wavelength $\lambda_1$, and first-order diffraction 166 of the second-layer features 306 at the first wavelength $\lambda_1$, in accordance with one or more embodiments of the present disclosure. As illustrated in FIG. 1I, the dark-field pupil stop 154 passes the first-order diffraction 164 of the first-layer features 304 at the first wavelength $\lambda_1$ and blocks the first-order diffraction 166 of the second-layer features 306 at the first wavelength $\lambda_1$.

FIG. 1J is a top view of a dark-field pupil stop 154 at a collection pupil plane 156 illustrating 0-order diffraction 162, first-order diffraction 164 of the first-layer features 304 at a second wavelength $\lambda_2$, and first-order diffraction 166 of the second-layer features 306 at the second wavelength $\lambda_2$, in accordance with one or more embodiments of the present disclosure. As illustrated in FIG. 1J, the dark-field pupil stop 154 blocks the first-order diffraction 164 of the first-layer features 304 at the second wavelength $\lambda_2$ and passes the first-order diffraction 166 of the second-layer features 306 at the second wavelength $\lambda_2$.

Figure 1K:
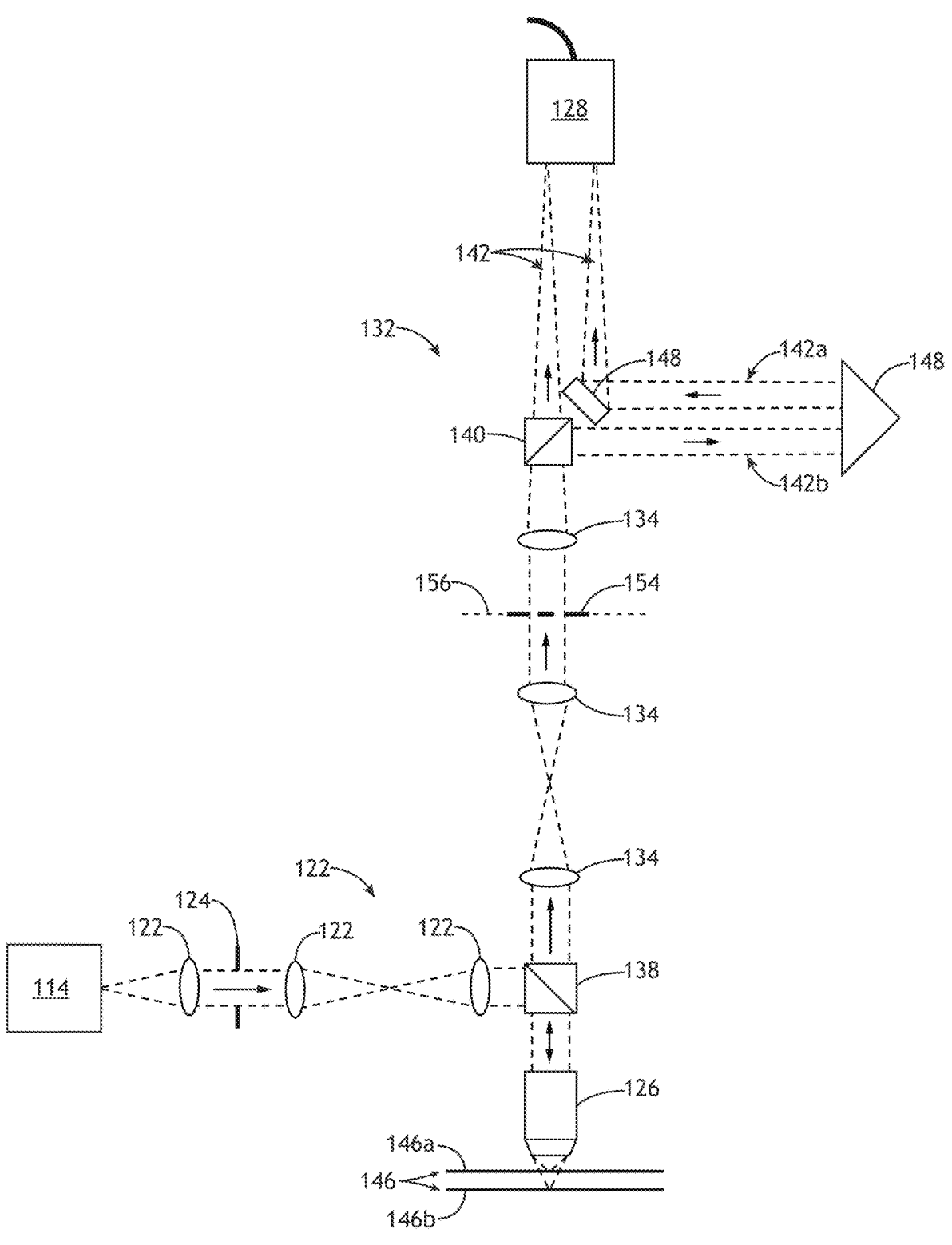
FIG. 1K is a conceptual view of a two-plane imaging metrology tool 106 providing in-focus images of first-layer features 304 and second-layer features 306 on a common detector 128, in accordance with one or more embodiments of the present disclosure.

Referring now to FIG. 1K, in some embodiments, images of features on different object planes 146 are formed on spatially different regions of a common sensor. In this way, the associated features are simultaneously in focus in the image.

FIG. 1K is a conceptual view of a two-plane imaging metrology tool 106 providing in-focus images of first-layer features 304 and second-layer features 306 on a common detector 128, in accordance with one or more embodiments of the present disclosure. In FIG. 1K, a conjugate beamsplitter 140 splits the collection light 130 into a first conjugate path 142a and a second conjugate path 142b. The collection light 130 from both conjugate paths 142 is then directly imaged onto different portions of the detector 128. Further, one or both of the conjugate paths 142 may include redirection optics 148 to provide different optical path lengths for the conjugate paths 142.

In this configuration, the conjugate beamsplitter 140 may include any type of beamsplitter known in the art including, but not limited to, a non-polarizing beamsplitter, a polarizing beamsplitter, or a dichroic beamsplitter. In this way, the imaging metrology tool 106 may implement any type of selectivity to distinguish the collection light 130 from the various object planes 146 in addition to spatial separation on the detector 128. The imaging metrology tool 106 may include a dark-field pupil stop 154 for further differentiation of the collection light 130 from the various object planes 146 as illustrated in FIGS. 1F-1J.

Referring again generally to FIGS. 1B-1K, it is contemplated herein that a multi-plane imaging metrology tool 106 is not limited to the determination of absolute positions of features on a single sample as described previously herein. Further, a multi-plane imaging metrology tool 106 is not limited to use in the sample mapping system 100. For example, the multi-plane imaging metrology tool 106 may be suitable for use as an overlay metrology tool. As an illustration, the multi-plane imaging metrology tool 106 may generate an image of overlay features on different sample layers, where the overlay features on both samples together form an overlay target such as, but not limited to, any of the designs of a metrology target 302 illustrated in FIGS. 3A-3E, where all features of the overlay target are simultaneously in focus. By way of another example, the multi-plane imaging metrology tool 106 may be suitable for use as an alignment tool. As an illustration, the multi-plane imaging metrology tool 106 may generate an image of alignment features on samples to be bonded in which all features are simultaneously in focus, where the features on both samples together form an alignment target such as, but not limited to, any of the designs of a metrology target 302 illustrated in FIGS. 3A-3E, where all features of the alignment target are simultaneously in focus.

Referring again to FIG. 1A, various additional components of the sample mapping system 100 are described in greater detail in accordance with one or more embodiments of the present disclosure.

In some embodiments, the sample mapping system 100 includes a sample bonder 168 configured to bond two samples to create a bonded sample. The sample bonder 168 may generally bond any types of samples to generate any type of bonded sample known in the art. For example, the sample bonder 168 may bond two or more wafers to form a W2 W bonded sample. By way of another example, the sample bonder 168 may bond a semiconductor die to a semiconductor wafer to form a D2 W sample.

In some embodiments, the sample mapping system 100 includes a controller 170, which may be communicatively coupled to any of the components of the sample marks 110. In another embodiment, the controller 170 includes one or more processors 172. For example, the one or more processors 172 may be configured to execute a set of program instructions maintained in a memory device 174, or memory. The one or more processors 172 of a controller 170 may include any processing element known in the art. In this sense, the one or more processors 172 may include any microprocessor-type device configured to execute algorithms and/or instructions.

The one or more processors 172 of a controller 170 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FP-GAs), or one or more digital signal processors (DSPs)). In this sense, the one or more processors 172 may include any device configured to execute algorithms and/or instructions (e.g., program instructions stored in memory). In one embodiment, the one or more processors 172 may be embodied as a desktop computer, mainframe computer system, workstation, image computer, parallel processor, networked computer, or any other computer system config-ured to execute a program configured to operate or operate in conjunction with the sample mapping system 100, as described throughout the present disclosure. Moreover, dif-ferent subsystems of the sample mapping system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple control-lers. Additionally, the controller 170 may include one or more controllers housed in a common housing or within multiple housings. In this way, any controller or combina-tion of controllers may be separately packaged as a module suitable for integration into sample mapping system 100.

The memory device 174 may include any storage medium known in the art suitable for storing program instructions executable by the associated one or more processors 172. For example, the memory device 174 may include a non-transitory memory medium. By way of another example, the memory device 174 may include, but is not limited to, a read-only memory (ROM), a random-access memory (RAM), a magnetic or optical memory device (e.g., disk), a magnetic tape, a solid-state drive and the like. It is further noted that the memory device 174 may be housed in a common controller housing with the one or more processors 172. In one embodiment, the memory device 174 may be located remotely with respect to the physical location of the one or more processors 172 and the controller 170. For instance, the one or more processors 172 of the controller 170 may access a remote memory (e.g., server), accessible through a network (e.g., internet, intranet and the like).

The controller 170 may direct (e.g., through control signals) or receive data from any component of the sample mapping system 100 including, but not limited to, the detector 128, the translation stage 112. The controller 170 may further be configured to perform any of the various process steps described throughout the present disclosure such as, but not limited to, steps associated with the method 700 for sample mapping or the method 800 for sample bonding described below.

In some embodiments, the sample mapping system 100 includes a user interface 176 communicatively coupled to the controller 170. In one embodiment, the user interface 176 may include, but is not limited to, one or more desktops, laptops, tablets, and the like. In another embodiment, the user interface 176 includes a display used to display data of the sample mapping system 100 to a user. The display of the user interface 176 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 176 is suitable for implementation in the present disclosure. In another embodiment, a user may input selections and/or instructions responsive to data displayed to the user via a user input device of the user interface 176.

In some embodiments, the sample bonder 168 includes an alignment system 178 to align samples to be bonded. In some embodiments, the imaging metrology tool 106 oper-ates as an alignment tool to align two samples prior to bonding. In this way, any of the teachings related to the determination of absolute coordinates and/or correction coordinates may be extended to provide alignment measure-ments of samples prior to bonding. For example, a multi-plane imaging metrology tool 106 may provide images of sample features on two samples to be bonded, where the sample features on both samples together form an alignment target such as, but not limited to, any of the designs of a metrology target 302 illustrated in FIGS. 3A-3E, where all features of the alignment target are simultaneously in focus. Samples to be bonded may be aligned prior to bonding using any technique known in the art. In some embodiments, at least some sample marks on each of the samples to be bonded correspond to portions of an alignment mark. In this way, the relative positions of the samples may be adjusted to align the samples within a selected tolerance based on the alignment measurements of the alignment marks.

Referring now to FIGS. 5A-6B, the sample mapping system 100 or a portion thereof such as the imaging metrol-ogy tool 106 may be used to determine overlay of a bonded sample (e.g., an overlay between the constituent samples, sample pieces, or the like). For example, the multi-plane imaging metrology tool 106 may generate an image of sample features on two samples that have been bonded, where sample features on both samples together form an overlay target such as, but not limited to, any of the designs of a metrology target 302 illustrated in FIGS. 3A-3E, where all features of the overlay target are simultaneously in focus.

Further, FIGS. 5A-6B illustrate a non-limiting example of a D2 W sample 502 formed from bonding a die 504 to a wafer 506 substrate. However, it is to be understood that FIGS. 5A-6B are provided solely for illustrative purposes and should not be interpreted as limiting. Rather, any type of bonded sample is within the spirit and scope of the present disclosure.

Figure 5A:
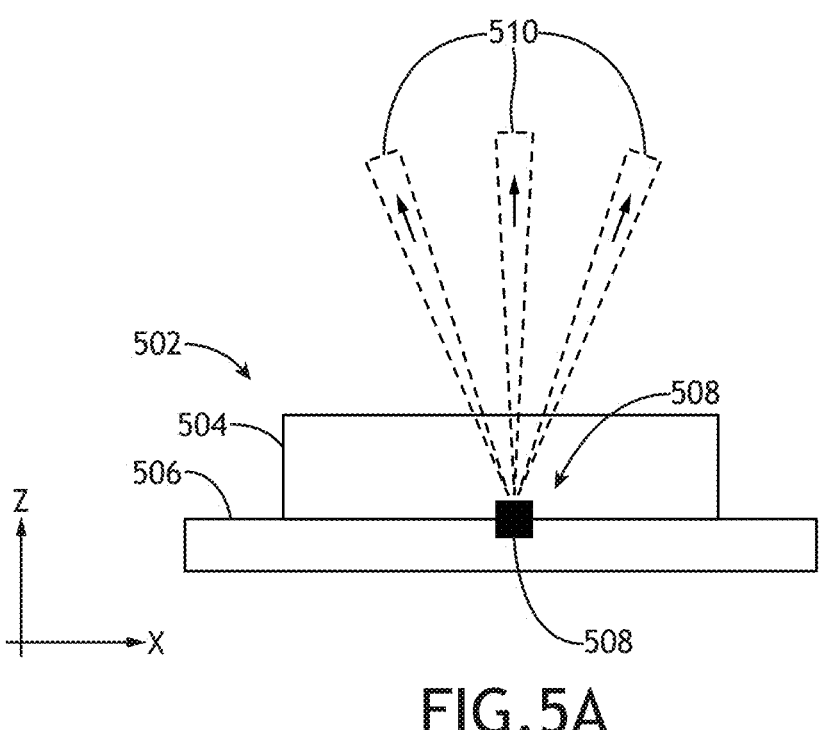
FIG. 5A is a side view in an X-Z plane of a bonded D2 W sample including an overlay metrology target with the design illustrated in FIGS. 3A-3C located near a die edge, in accordance with one or more embodiments of the present disclosure.
Figure 5B:
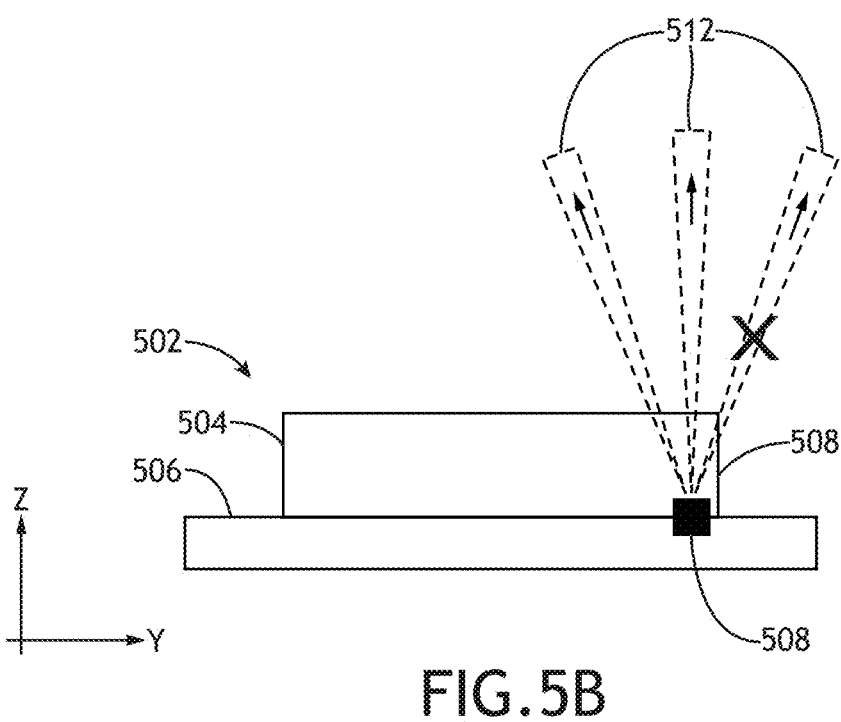
FIG. 5B is a side view in a Y-Z plane of the bonded D2 W sample in FIG. 5A, in accordance with one or more embodiments of the present disclosure.

It is contemplated herein that it may be desirable to place such overlay targets near the sample edges to achieve high accuracy. For example, in the case of a D2 W sample 502, overlay targets suitable for measurement of the overlay of the bonding of a die to a wafer may be placed near the edges of the die 504. However, it is further contemplated herein that geometric shadowing may limit how close the overlay targets may be positioned to the edges. FIGS. 5A and 5B illustrate the negative impact of geometric shadowing for a metrology target 302 placed near a die edge 508 of a D2 W sample 502. FIG. 5A is a side view in an X-Z plane of a bonded D2 W sample 502 including an overlay metrology target 302 with the design illustrated in FIGS. 3A-3C located near a die edge 508, in accordance with one or more embodiments of the present disclosure. FIG. 5B is a side view in a Y-Z plane of the bonded D2 W sample 502 in FIG. 5A, in accordance with one or more embodiments of the present disclosure. In particular, FIG. 5A illustrates several X-direction diffraction orders 510 emanating from the fea-tures of the metrology target 302 that are periodic along the X-direction and FIG. 5B illustrates several Y-direction dif-fraction orders 512 emanating from the features of the metrology target 302 that are periodic along the Y-direction. As illustrated in FIGS. 5A and 5B, diffraction orders along a direction parallel to the die edge 508 (e.g., X-direction diffraction orders 510 here) are not affected or are negligibly affected by the die edge 508, whereas at least some of the diffraction orders perpendicular to the die edge 508 (e.g., X-direction diffraction orders 510 here) may be affected by the die edge 508. In FIG. 5B, this is illustrated by one of the Y-direction diffraction orders 512 marked with an "X" that impacts the die edge 508, which may impact the associated image of the metrology target 302 or a measurement more generally.

Accordingly, in some embodiments, overlay targets for characterizing bonded samples may be positioned near die edges and may further include features that are periodic along the direction of proximate die edges to mitigate the effect of geometric shadowing illustrated in FIGS. 5A and 5B. In particular, FIGS. 6A and 6B provide non-limiting illustrative examples of the placement and orientation of overlay targets for bonded sample characterization on a D2 W sample 502.

Figure 6A:
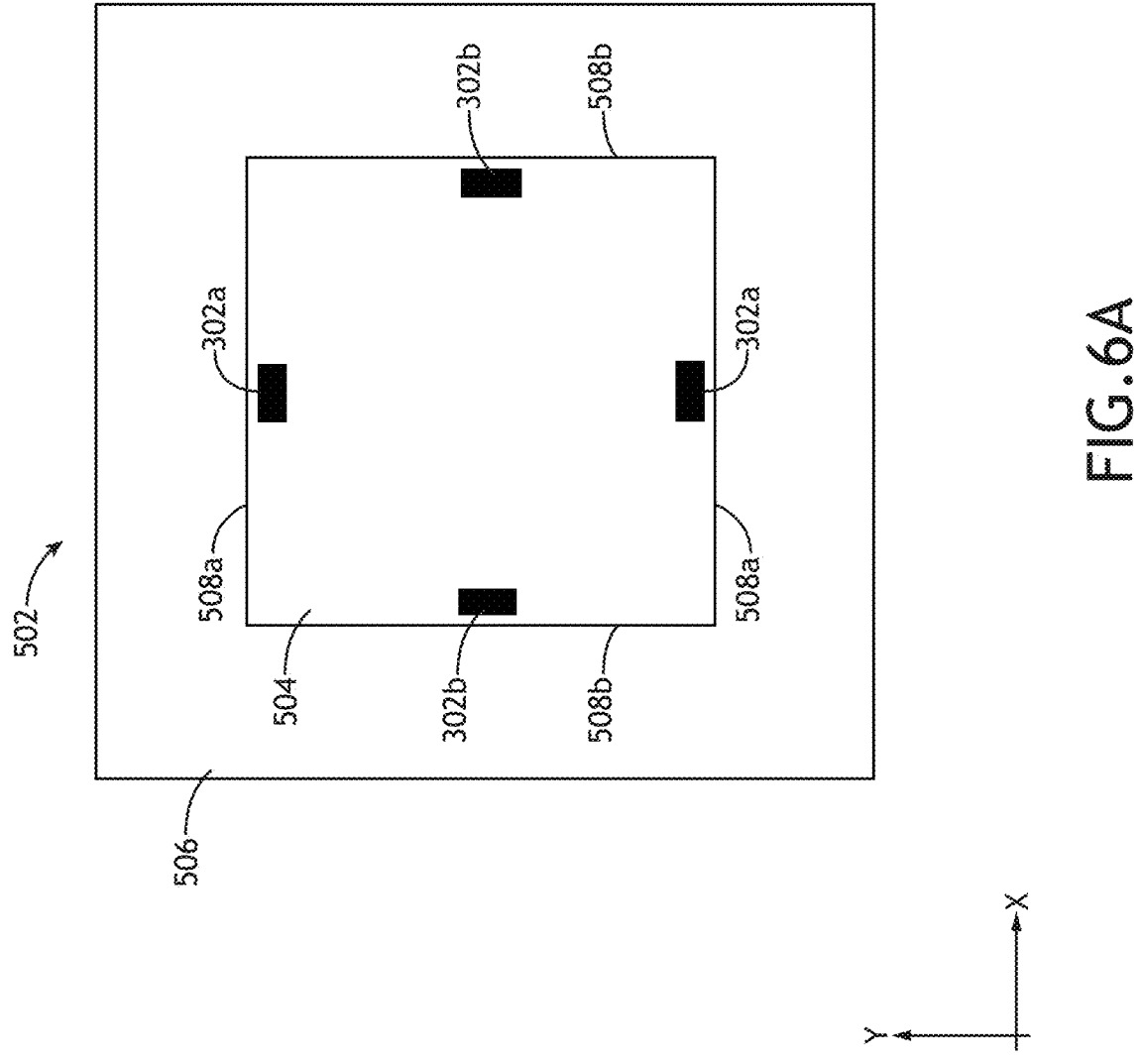
FIG. 6A is a top view of a first layout of a D2 W sample including a set of overlay targets for characterization of the bonding process, in accordance with one or more embodiments of the present disclosure.

FIG. 6A is a top view of a first layout of a D2 W sample 502 including a set of overlay targets for characterization of the bonding process, in accordance with one or more embodiments of the present disclosure. In FIG. 6A, at least one X-direction overlay metrology target 302a is placed along an X-direction die edge 508a and at least one Y-direction overlay metrology target 302b is placed along a Y-direction die edge 508b. For example, the X-direction overlay metrology target 302a may be, but are not required to be, of the design illustrated in FIG. 3D and the Y-direction overlay metrology target 302b may be, but are not required to be, of the design illustrated in FIG. 3E. Further, the X-direction overlay metrology target 302a and the Y-direction overlay metrology target 302b may be located at any suitable location along the respective die edges such as, but not limited to, a central portion of the die 504 as illustrated in FIG. 6A.

Figure 6B:
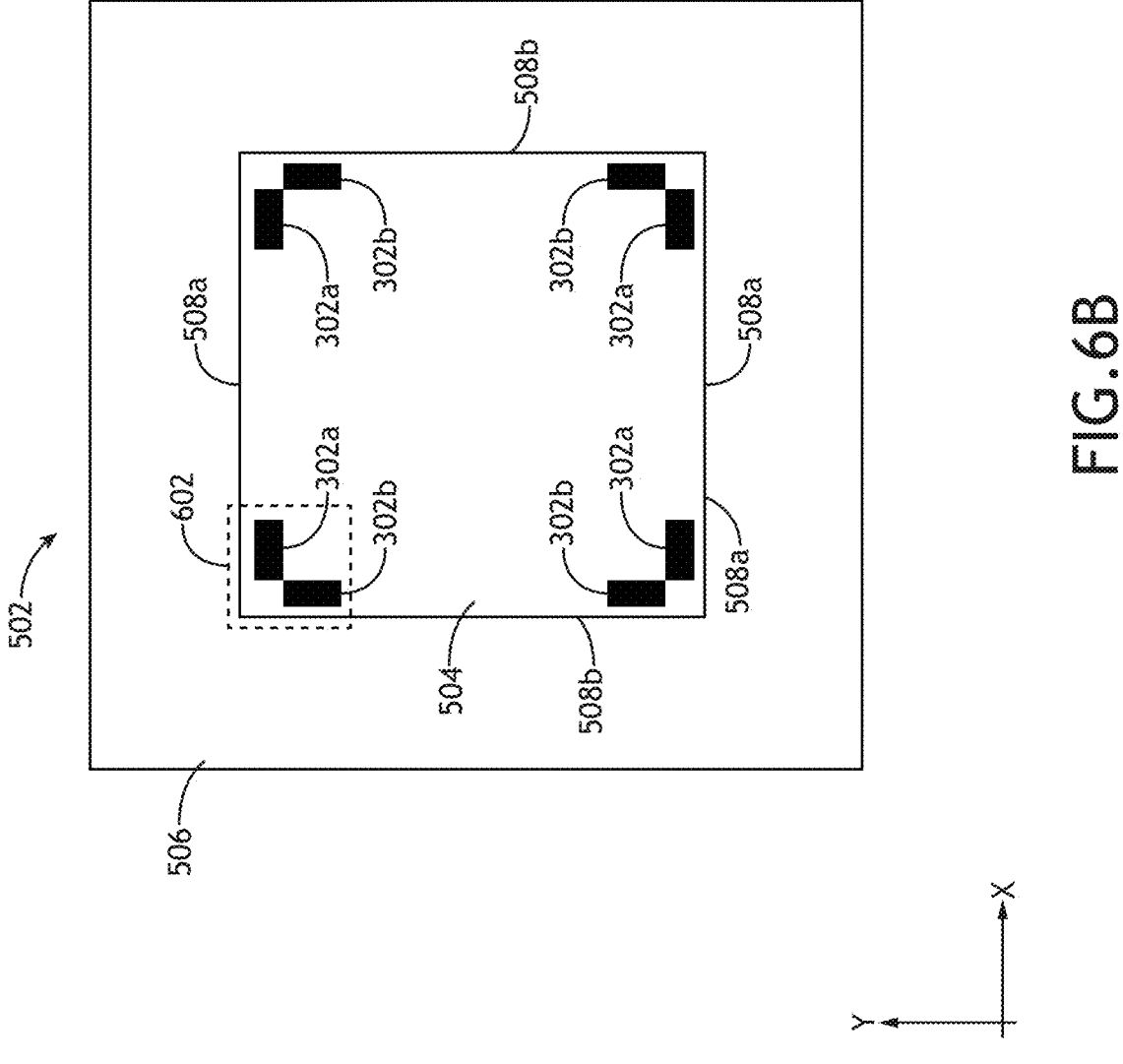
FIG. 6B is a top view of a second layout of a D2 W sample including a set of overlay targets for characterization of the bonding process, in accordance with one or more embodiments of the present disclosure.

FIG. 6B is a top view of a second layout of a D2 W sample 502 including a set of overlay targets for characterization of the bonding process, in accordance with one or more embodiments of the present disclosure. The layout illustrated in FIG. 6B is similar to that of FIG. 6A, except that an X-direction overlay metrology target 302a and a Y-direction overlay metrology target 302b are located near a corner close enough to be within a field of view 602 of an overlay tool (e.g., the sample mapping system 100, the imaging metrology tool 106, or the like). Accordingly, the layout in FIG. 6B may reduce a number of measurements by a factor of 2 relative to layouts including isolated single-direction targets such as the layout in FIG. 6A.

Referring now to FIGS. 7A-8, various methods for advanced packaging are described in greater detail, in accordance with one or more embodiments of the present disclosure.

FIG. 7A is a flow diagram illustrating steps performed in a method 700 for sample mapping, in accordance with one or more embodiments of the present disclosure. The embodiments and enabling technologies described previously herein in the context of the sample mapping system 100 should be interpreted to extend to the method 700. It is further noted, however, that the method 700 is not limited to the architecture of the sample mapping system 100.

In some embodiments, the method 700 includes a step 702 of placing a sample including one or more sample marks on a sample chuck with absolute reference marks. The sample marks may generally include any features on the sample for which absolute coordinates are desired. The absolute reference marks may include any type of reference marks suitable for defining absolute positions of the sample marks.

Considering the sample mapping system 100 described with respect to FIGS. 1A-4 as an illustrative example, the absolute reference marks of the method 700 may include any of the absolute reference marks 104 described with respect to FIGS. 1A-4. In some embodiments, the absolute reference marks may include coordinate values 204 and/or a coordinate grid 202 associated with any suitable coordinate system. In some embodiments, the absolute reference marks may include features associated with a metrology target (e.g., an overlay target, an alignment target, or the like) as illustrated in FIGS. 3A-3E. For instance, certain absolute reference marks 104 may form a subset of features associated with a metrology target, where certain sample features form an additional subset of features associated with the metrology target.

Further, the absolute reference marks may be permanently, semi-permanently, or temporarily attached or otherwise disposed on the sample chuck. For example, the absolute reference marks may be formed as, but are not limited to, painted marks, grooves, raised portions, chemically-treated marks, a film of patterned material, or as displayed marks on a display device visible through a transparent window in the sample chuck.

In some embodiments, the method 700 includes a step 704 of determining absolute coordinates of the one or more sample marks based on the absolute reference marks. FIG. 7B is a flow diagram illustrating steps associated with the step 704 of determining absolute coordinates of the one or more sample marks, in accordance with one or more embodiments of the present disclosure. In particular, FIG. 7B illustrates steps associated with determining absolute coordinates associated with a particular sample mark of the set of sample marks (e.g., any one of the sample marks) on the sample. The steps in FIG. 7B may thus be repeated for each sample mark on the sample for which absolute coordinates are desired. Further, the absolute coordinates of various sample marks on a sample may be provided as, but is not required to be provided as, an absolute sample map.

In some embodiments, determining absolute coordinates of a particular sample mark includes a step 706 of translating the sample to place a particular sample mark within a field of view of an imaging metrology tool. Continuing the example of the sample mapping system 100, the sample may be translated to a field of view of the imaging metrology tool 106 using the translation stage 112.

In some embodiments, determining absolute coordinates of a particular sample mark includes a step 708 of capturing one or more alignment images with the imaging metrology tool at this location (e.g., this lateral location), where at least one of the one or more alignment images at this location corresponds to the particular sample mark and where at least one of the one or more alignment images corresponds to a portion of the absolute reference marks within the field of view of the imaging metrology tool visible to the imaging metrology tool through the sample. In some embodiments, determining absolute coordinates of a particular sample mark includes a step 710 of determining the absolute coordinates of the particular sample mark based on the one or more alignment images.

The alignment images generated at a particular location may include any combination of field-plane images (e.g., images of the structure of the sample mark and/or portions of the absolute reference marks) or pupil-plane images (e.g., images of the angular distribution of light from the sample mark and/or portions of the absolute reference marks).

Further, any number of alignment images may be generated at this location. In some cases, it may be necessary or desirable to generate multiple alignment images at this location. For example, the particular sample mark and the particular portion of the absolute reference marks may be separated along an axial direction by a distance greater than the DOF of the imaging metrology tool. Accordingly, separate alignment images may be generated using measurement recipes (e.g., a set of measurement conditions or parameters of the imaging metrology tool) tailored for the particular sample mark and the particular portion of the absolute reference marks. In some embodiments, alignment images are generated at multiple focusing depths (e.g., axial locations). For example, at least one alignment image may be generated with the particular sample mark at an object plane of the imaging metrology system (e.g., such that the particular sample mark is in focus in a field-plane image) and at least one alignment image is generated with the particular portion of the absolute reference marks at the object plane of the imaging metrology system (e.g., such that the particular portion of the absolute reference marks is in focus in the imaging metrology system). In some embodiments, the imaging metrology system is a multi-plane imaging metrology system such as, but not limited to, the multi-plane imaging metrology tool 106 illustrated in FIGS. 1C-1F. In this way, the particular sample mark and the particular portion of the absolute reference marks may be simultaneously in focus in a single image even if they are axially separated by more than the DOF of the imaging metrology tool 106.

In some embodiments, the particular sample mark and the particular portion of the absolute reference marks below the particular sample mark (and the surrounding area in the field of view of the imaging metrology tool) may be sufficiently closer together than a DOF of the imaging metrology tool such that only one alignment image is necessary. For example, the particular sample mark and the particular portions of the absolute reference marks may all be in focus (or within a selected tolerance) in a single alignment image.

It is contemplated herein that the step 710 of determining the absolute coordinates of the particular sample mark based on the one or more alignment images may be implemented in various ways within the spirit and scope of the present disclosure.

The one or more alignment images generated at a particular location may generally be analyzed separately or combined into a composite image. For example, a position of the particular portion of the absolute reference marks within the field of view or other fixed space may be determined based on one alignment image and a position of the particular sample feature within the field of view or other fixed space based on another alignment image. The relative positions may then be determined by the extracted positions. By way of another example, one or more compound images may be formed. As an illustration, a first region of a compound image may include the particular sample feature using data from one alignment image and a second region of the compound image may include the particular portions of the absolute reference marks extracted from another alignment image. In a general sense, any technique for analyzing the one or more alignment images, or the data therein, is within the spirit and scope of the present disclosure.

In some embodiments, the absolute reference marks define or are representative of an absolute reference coordinate system. In this way, the absolute coordinates of the particular sample mark may correspond to coordinates in the absolute reference coordinate system. For example, the absolute reference marks may include coordinate values and/or a coordinate grid as described previously herein. In this way, the step 710 may include determining a relative position (e.g., lateral position and/or rotation) within the context of the absolute reference coordinate system. As an illustration, the particular sample mark may be visible on or between the visible coordinate values and/or coordinate grid markings such that absolute coordinates of the particular sample mark may be determined by interpolation between the visible coordinate values and/or coordinate grid markings.

In some embodiments, the step 710 of determining the absolute coordinates of the particular sample mark based on the one or more alignment images includes determining correction coordinates to be combined with preliminary coordinates known by previous means. For example, preliminary coordinates of the particular sample mark may be known through design data, a system recipe, pre-gds information, or the like. However, it may be the case that the actual (e.g., absolute) coordinates of the particular sample mark may differ from the expected preliminary coordinates due to fabrication or other errors. Further, it may be the case that the translation stage used to align the particular sample mark with the imaging metrology tool may experience drift or other inaccuracies that exceed the positioning tolerances of a particular application.

As an illustration, the particular sample mark may be aligned to the imaging metrology tool based on preliminary coordinates $(X_i, Y_i, \theta_i)$, where the subscript i refers to the particular sample mark, the terms X and Y are lateral coordinates and the term $\theta$ is a rotational coordinate). Due to any combination of error, it may be the case that the particular sample mark is not centered in the field of view of the imaging metrology tool or is otherwise not in the expected position (or orientation). In this case, the step 710 may include determining correction coordinates (or a correction function more generally) to correct the preliminary coordinates of the particular sample mark and thus determine absolute coordinates of the particular sample mark. This may be based on alignment images generated at the expected position (e.g., a position associated with the preliminary coordinates) or after centering the particular sample mark in the field of view.

Such an approach may be implemented with a wide variety of types of absolute reference marks including, but not limited to, coordinate values and/or coordinate grid markings (e.g., as illustrated in FIGS. 2A-2C) or absolute reference marks forming a portion of a metrology mark (e.g., as illustrated in FIGS. 3A-3E). For instance, correction coordinates (or the correction function more generally) may be determined based on a difference between an expected position of the particular sample mark and an actual position of the particular sample mark relative to the particular portion of the absolute reference marks.

It is contemplated herein that any of the techniques described herein may be suitable for generating absolute position coordinates with an accuracy and/or a repeatability equal to or better than achievable based on encoders of a translation stage. In some embodiments, the systems and methods disclosed herein are suitable for determining absolute coordinates with sub-micron accuracy. Further, it is contemplated herein that it may be cost prohibitive to achieve a desired level of accuracy and/or repeatability solely with a translation stage. Accordingly, the systems and methods disclosed herein may provide a cost-effective approach for absolute mapping of sample features.

In some embodiments, the method 700 includes a step 712 of controlling one or more process tools based on the absolute coordinates of at least one of the one or more sample marks. It is further contemplated herein that the method 700 for determining absolute coordinates of sample features may further be used for various types of process control. For example, the absolute coordinates of at least one sample mark may be used as feed-forward data to control one or more process tools for a subsequent process step. By way of another example, the absolute coordinates of at least one sample mark may be used as feedback data to control one or more process tools for the fabrication of subsequent samples. By way of another example, the absolute coordinates of at least one sample mark may be used as feedback data to control one or more process tools in an advanced process control system. Advanced process control is described generally in U.S. Pat. No. 8,655,469 issued on Feb. 18, 2014, which is incorporated by reference herein in its entirety.

In some embodiments, the method 700 includes a step 714 of monitoring a health of one or more process tools (e.g., lithography tool, etching tools, polishing tools, or the like) based on the absolute coordinates of at least one of the one or more sample marks. For example, variations in the absolute coordinates of sample marks relative to expected (e.g., preliminary) coordinates may be an indication that one or more process tools are deviating from specifications and may need to be updated.

Referring now to FIG. 8, FIG. 8 is a flow diagram of a method 800 for sample bonding, in accordance with one or more embodiments of the present disclosure. The embodiments and enabling technologies described previously herein in the context of the sample mapping system 100 should be interpreted to extend to the method 800. It is further noted, however, that the method 800 is not limited to the architecture of the sample mapping system 100.

It is contemplated herein that the method 700 may be suitable for the fabrication of bonded samples (e.g., W2 W samples, D2 W samples, or the like) within tight alignment tolerances. In particular, achieving accurate alignment in a sample bonding process may require highly accurate knowledge of various features on the constituent sample pieces such as, but not limited to, bonding pads, alignment marks used to align samples prior to bonding or overlay marks (or portions thereof) after bonding. For example, an overlay target for measuring alignment of bonded samples may be formed by features located on each of the samples such that an overlay measurement of the overlay target after bonding may provide a measurement of the alignment accuracy of the bonded sample.

In some embodiments, the method 800 includes a step 802 of generating absolute position maps for two or more samples, where an absolute position map for a particular sample of the two or more samples includes absolute coordinates of one or more sample marks on the particular sample. For example, the method 700 may be used to generate absolute position maps for the two or more samples. Further, the sample marks may include, but are not limited to, bonding pads, alignment marks, or overlay marks (or portions thereof).

In some embodiments, the method 800 includes a step 804 aligning a first sample from the two or more samples and a second sample from the two or more samples based on an absolute position map of the first sample and an absolute position map of the second sample. In some embodiments, the method 800 includes a step 806 bonding the first sample to the second sample based on the alignment to form a bonded sample.

It is contemplated herein that knowledge of the absolute coordinates of bonding pads and/or alignment marks on the first and second samples may facilitate accurate alignment of the samples prior to bonding. As an illustration, sample marks on the first and second samples may correspond to alignment marks that combine to provide an alignment target. For example, the first and second samples may be aligned by measuring relative positions of the first and second samples based on the alignment marks and adjusting the relative positions of the first and second samples based on the measurements.

In some embodiments, the method 800 includes a step 808 of selecting the first sample and the second sample for bonding. For example, the step 802 may include generating absolute position maps for three or more samples. In this way, the step 808 may include selecting two compatible samples (e.g., the first and second samples) for bonding based on the absolute alignment maps for all samples tested. It is contemplated herein that absolute placement maps generated using the method 700 may enable accurate selection of samples that are compatible for bonding. As described previously herein, it may be the case that the actual absolute positions of various sample features (bonding pads, alignment marks, overlay marks, or the like) may deviate from expected (e.g., preliminary) positions or coordinates. Accordingly, the step 808 may select samples for bonding that have similar actual positions of corresponding sample features (e.g., bonding pads, alignment marks, overlay marks, or the like) to promote accurate alignment and construction of a bonded sample. Further, the step 808 may be repeated to select any number of pairs of compatible samples from a pool of samples based on absolute placement maps of all samples in the pool of samples.

In some embodiments, the method 800 includes a step 810 of measuring overlay of the bonded sample. It is contemplated herein that the same imaging metrology tool used to generate the absolute position maps of the constituent samples that form the bonded sample (e.g., the imaging metrology tool 106, or the like) may also be used to provide an overlay measurement of the bonded sample. In this way, a common system may be used for both pre-bonding and post-bonding measurements to provide a cost-effective system.

For example, FIGS. 3A-3E may be representative of an overlay target in which the first-layer features 304 are located on one sample (e.g., the first sample of the method 800) and the second-layer features 306 are located on another sample (e.g., the second sample of the method 800) such that a complete metrology target 302 is formed on the bonded sample. Accordingly, the imaging metrology tool may generate one or more images of the first-layer features 304 and the second-layer features 306 in any manner similar to the generation of the one or more alignment features as described with respect to the formation of absolute placement maps and relative positions of the first-layer features 304 and the second-layer features 306 (e.g., an overlay measurement) may be determined using any overlay technique known in the art. In some embodiments, the imaging metrology tool may generate separate images of the first-layer features 304 and the second-layer features 306 by translating the bonded sample axially to sequentially align the first-layer features 304 and the second-layer features 306 to an object plane of the imaging metrology tool for image capture. In some embodiments, the first-layer features 304 and the second-layer features 306 may be within a DOF of the imaging metrology tool such that the overlay may be determined based on a single image. In some embodiments, the imaging metrology tool used for bonded sample overlay measurements is configured as a multi-plane imaging metrology tool (e.g., as illustrated in FIGS. 1C-1F). Accordingly, the first-layer features 304 and the second-layer features 306 may each be located at object planes such that both the first-layer features 304 and the second-layer features 306 may be simultaneously in focus in a field-plane image even if they are axially separated by more than the DOF.

Additionally, it is to be understood that an overlay target of the bonded sample is not limited to the design illustrated in FIGS. 3A-3E and may generally include any overlay target design known in the art. For example, the overlay target may be formed as an image-based overlay target such as, but not limited to, a BiB target, a BnB target, an AIM target, a triple AIM target, or a rAIM target. By way of another example, the overlay target may be formed as a scatterometry-based target such as, but not limited to, a grating-over-grating target.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A sample mapping system comprising:
a sample chuck including absolute reference marks;
an imaging metrology tool configured to capture sets of one or more alignment images at locations associated with one or more sample marks on a sample disposed on the sample chuck, wherein a particular set of one or more alignment images at a particular location includes at least one alignment image associated with a particular sample mark of the one or more sample marks and further includes at least one alignment image associated with a particular portion of the absolute reference marks within a field of view of the imaging metrology tool visible through the sample; and
a controller communicatively coupled to the imaging metrology tool, the controller including one or more processors configured to execute program instructions causing the one or more processors to determine absolute coordinates of the one or more sample marks based on the sets of one or more alignment images, wherein determining the absolute coordinates of the particular sample mark comprises determining the absolute coordinates of the particular sample mark based on a position of the particular sample mark relative to the particular portion of the absolute reference marks using the particular set of one or more alignment images,
wherein the particular portion of the absolute reference marks has a wavelength-dependent reflectivity, wherein the at least one alignment image associated with the particular portion of the absolute reference marks is captured using illumination at a wavelength at which the absolute reference marks has a reflectivity above a selected threshold.

2. The sample mapping system of claim 1, wherein the absolute coordinates of the one or more sample marks are indicative of at least one of lateral positions of the one or more sample marks, rotational positions of the one or more sample marks, or sizes of the one or more sample marks.

3. The sample mapping system of claim 1, wherein the sets of one or more alignment images include at least one field-plane image.

4. The sample mapping system of claim 1, wherein the sets of one or more alignment images include at least one pupil-plane image.

5. The sample mapping system of claim 1, wherein the particular set of one or more alignment images associated with the particular sample mark comprises a single alignment image.

6. The sample mapping system of claim 5, wherein the particular sample mark and the particular portion of the absolute reference marks are separated along an axial direction orthogonal to an object plane of the imaging metrology tool by a distance smaller than a depth of field of the imaging metrology tool.

7. The sample mapping system of claim 5, wherein the single alignment image comprises a field-plane image, wherein the particular sample mark and the particular portion of the absolute reference marks are in focus in the single alignment image.

8. The sample mapping system of claim 5, wherein the particular sample mark and the particular portion of the absolute reference marks are separated along an axial direction orthogonal to an object plane of the imaging metrology tool by a distance larger than a depth of field of the imaging metrology tool.

9. The sample mapping system of claim 8, wherein the imaging metrology tool comprises:
a multi-plane imaging metrology tool including two or more object planes, wherein a first of the two or more object planes corresponds to a plane including the absolute reference marks, wherein a second of the two or more object planes corresponds to a plane of the sample including the particular sample mark.

10. The sample mapping system of claim 9, wherein the multi-plane imaging metrology tool comprises:
an illumination sub-system configured to direct illumination from an illumination source to the sample; and
an imaging sub-system configured to simultaneously image the two or more object planes onto a detector, wherein the imaging sub-system comprises:
an objective lens to collect light from the sample as collection light;
one or more beamsplitters, wherein the one or more beamsplitters split the collection light into two or more conjugate paths; and the detector to receive the collection light from the two or more conjugate paths, wherein the two or more conjugate paths have different optical path lengths to simultaneously image the two or more object planes onto the detector.

11. The sample mapping system of claim 10, wherein the one or more beamsplitters further recombine the collection light from the two or more conjugate paths to a common optical path including the detector.

12. The sample mapping system of claim 10, wherein the collection light from the two or more conjugate paths is spatially separated on the detector.

13. The sample mapping system of claim 1, wherein the particular set of one or more alignment images associated with the particular sample mark comprises a first alignment image and a second alignment image.

14. The sample mapping system of claim 13, wherein the first alignment image is captured when the particular sample mark is at an object plane of the imaging metrology tool, wherein the second alignment image is captured when the particular portion of the absolute reference marks is at the object plane of the imaging metrology tool.

15. The sample mapping system of claim 13, wherein the first alignment image is a field-plane image in which the particular sample mark is in focus, wherein the second alignment image is a field-plane image in which the particular portion of the absolute reference marks is in focus.

16. The sample mapping system of claim 1, wherein the absolute reference marks are representative of an absolute reference coordinate system, wherein determining the absolute coordinates of the particular sample mark based on the position of the particular sample mark relative to the particular portion of the absolute reference marks using the particular set of one or more alignment images comprises:
 determining the position of the particular sample mark in the absolute reference coordinate system using the particular set of one or more alignment images.

17. The sample mapping system of claim 16, wherein the absolute reference marks comprise:
 at least one of a set of coordinate values or a coordinate grid associated with the absolute reference coordinate system.

18. The sample mapping system of claim 1, wherein determining the absolute coordinates of the particular sample mark based on a position of the particular sample mark relative to the particular portion of the absolute reference marks using the particular set of one or more alignment images comprises:
 receiving preliminary coordinates of the particular sample mark;
 determining the position of the particular sample mark relative to the particular portion of the absolute reference marks using the particular set of one or more alignment images; and
 determining correction coordinates of the particular sample mark based on the position of the particular sample mark relative to the particular portion of the absolute reference marks, wherein the absolute coordinates include a combination of the preliminary coordinates and the correction coordinates.

19. The sample mapping system of claim 18, wherein the particular sample mark forms a first portion of a metrology target, wherein the particular portion of the absolute reference marks forms a second portion of the metrology target.

20. The sample mapping system of claim 19, wherein the metrology target comprises an overlay target, wherein determining the absolute coordinates of the particular sample mark based on the position of the particular sample mark relative to the particular portion of the absolute reference marks using the particular set of one or more alignment images comprises:
 generating a metrology measurement using the particular set of one or more alignment images; and
 determining the absolute coordinates of the particular sample mark based on the metrology measurement.

21. The sample mapping system of claim 20, wherein the metrology target comprises:
 an image-based overlay target.

22. The sample mapping system of claim 21, wherein the image-based overlay target comprises:
 at least one of an advanced imaging metrology (AIM) target, a triple AIM target, an in-die AIM target, a box-in-box metrology target, or a bar next to bar metrology target.

23. The sample mapping system of claim 20, wherein the overlay target comprises:
 a scatterometry-based overlay target.

24. The sample mapping system of claim 23, wherein the scatterometry-based overlay target comprises:
 a grating-over-grating target.

25. The sample mapping system of claim 1, wherein the absolute reference marks are formed as at least one of printed, painted, or grooved features on the sample chuck.

26. The sample mapping system of claim 1, wherein absolute reference marks are formed as a film disposed on the sample chuck.

27. The sample mapping system of claim 1, wherein the sample chuck comprises:
 a transparent window; and
 a display device below the transparent window, wherein the absolute reference marks are formed as displayed features on the display device.

28. The sample mapping system of claim 27, wherein the display device comprises at least one of a liquid crystal display device, a light-emitting diode device, or an organic light emitting diode device.

29. The sample mapping system of claim 27, wherein at least one of a pattern or positions of the absolute reference marks are adjustable.

30. The sample mapping system of claim 1, wherein the particular portion of the absolute reference marks has a polarization-dependent reflectivity, wherein the at least one alignment image associated with a particular portion of the absolute reference marks is captured using a measurement recipe providing a reflectivity of the particular portion of the absolute reference marks above a selected threshold.

31. The sample mapping system of claim 1, wherein a positional accuracy of the absolute coordinates is higher than a positional accuracy of a translation stage used to position the sample for generating the sets of one or more alignment images.

32. The sample mapping system of claim 1, wherein a positional accuracy of the absolute coordinates is less than a micrometer.

* * * * *